(12) United States Patent
Park et al.

(10) Patent No.: US 9,668,114 B2
(45) Date of Patent: May 30, 2017

(54) METHOD FOR OUTPUTTING NOTIFICATION INFORMATION AND ELECTRONIC DEVICE THEREOF

(71) Applicant: Samsung Electronics Co., Ltd., Suwon-si, Gyeonggi-do (KR)

(72) Inventors: Kyong-Ha Park, Suwon-si (KR); Jeong-Min Park, Hwaseong-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 0 days.

(21) Appl. No.: 15/160,232

(22) Filed: May 20, 2016

(65) Prior Publication Data

US 2016/0360384 A1 Dec. 8, 2016

(30) Foreign Application Priority Data

Jun. 5, 2015 (KR) ........................ 10-2015-0079980

(51) Int. Cl.
| | |
|---|---|
| *G08B 1/08* | (2006.01) |
| *H04W 4/12* | (2009.01) |
| *H03G 3/32* | (2006.01) |
| *H04R 3/00* | (2006.01) |
| *G06F 3/16* | (2006.01) |
| *G08C 17/02* | (2006.01) |

(52) U.S. Cl.
CPC ............. *H04W 4/12* (2013.01); *G06F 3/167* (2013.01); *G08C 17/02* (2013.01); *H03G 3/32* (2013.01); *H04R 3/00* (2013.01); *H04R 2430/01* (2013.01); *H04R 2499/15* (2013.01)

(58) Field of Classification Search
CPC  H04W 4/12; G06F 3/167; H03G 3/32; H04R 3/00; H04R 2430/01
USPC ...................................... 340/539.11
See application file for complete search history.

(56) References Cited

U.S. PATENT DOCUMENTS

| | | | |
|---|---|---|---|
| 8,538,376 B2* | 9/2013 | Lee ................... | H04M 1/72566 455/405 |
| 9,117,447 B2* | 8/2015 | Gruber ................ | G06F 3/167 |
| 2013/0127980 A1* | 5/2013 | Haddick ............... | G06F 3/013 348/14.08 |
| 2016/0224176 A1* | 8/2016 | Kim .................... | G06F 1/163 |

FOREIGN PATENT DOCUMENTS

| | | | |
|---|---|---|---|
| JP | 2005-86328 A | 3/2005 | |
| JP | 5869712 B1 * | 2/2016 | ............ G06T 19/00 |
| KR | 10-2006-0026336 A | 3/2006 | |
| KR | 10-2009-0034224 A | 4/2009 | |

* cited by examiner

*Primary Examiner* — John A Tweel, Jr.
(74) *Attorney, Agent, or Firm* — Jefferson IP Law, LLP

(57) ABSTRACT

An electronic device and method for operating the electronic device are provided. The method for operating the electronic device includes in response to a content being reproduced, acquiring ambient environment information through a sensor module, which is electrically connected to the electronic device, or an external electronic device, determining at least one attribute regarding notification information corresponding to the ambient environment information, and providing the notification information in connection with the content based on the at least one attribute.

27 Claims, 18 Drawing Sheets

METHOD FOR OUTPUTTING NOTIFICATION INFORMATION AND ELECTRONIC DEVICE THEREOF

CROSS-REFERENCE TO RELATED APPLICATION(S)

This application claims the benefit under 35 U.S.C. §119(a) of a Korean patent application filed on Jun. 5, 2015 in the Korean Intellectual Property Office and assigned Serial No. 10-2015-0079980, the entire disclosure of which is hereby incorporated by reference.

TECHNICAL FIELD

The present disclosure relates to an electronic device. More particularly, the present disclosure relates to a method for outputting notification information corresponding to an ambient situation in an electronic device, and an electronic device thereof

BACKGROUND

With the development of image reproducing devices and image quality, body-mounted electronic devices (for example, a head-mounted-device (HMD)) are developing. The body-mounted electronic device is able to provide virtual reality or augmented reality to users through images. Additionally, the body-mounted electronic device is able to recognize a user's motion and display a display screen in response to the recognized motion. Accordingly, the user of the body-mounted electronic device can view various contents as if the contents exist in real world.

The above information is presented as background information only to assist with an understanding of the present disclosure. No determination has been made, and no assertion is made, as to whether any of the above might be applicable as prior art with regard to the present disclosure.

SUMMARY

The body-mounted electronic device (for example, the head-mounted device (HMD)) provides a user with a virtual environment service or a stereoscopic image (for example, a 3-dimensional (3D) image) to make the user feel a sense of space in a plane image, so that the user can be completely immersed in a virtual world. However, since the user uses user's senses of sight and hearing to enjoy contents through the body-mounted electronic device, the user may have difficulty in detecting a dangerous situation which is caused by an external environment or a situation that needs a notification. Therefore, there is a need for a method for providing a user with information on a dangerous situation which is caused by an external environment or information on a situation which needs a notification through the body-mounted electronic device.

Aspects of the present disclosure are to address at least the above-mentioned problems and/or disadvantages and to provide at least the advantages described below. Accordingly, an aspect of the present disclosure is to provide a method and apparatus for outputting notification information to a user in an electronic device.

Another aspect of the present disclosure is to provide a method and apparatus for executing pre-stored ambient environment information corresponding to a notification event in response to an input to reproduce the ambient environment information in an electronic device.

In accordance with an aspect of the present disclosure, an electronic device is provided. The electronic device includes a sensor module, a memory, and a processor electrically connected to the sensor module and the memory. The processor is configured to reproduce a content, acquire ambient environment information through the sensor module or an external electronic device, determine at least one attribute regarding notification information corresponding to the ambient environment information, and provide the notification information in connection with the content based on the at least one attribute.

In accordance with another aspect of the present disclosure, a method for operating an electronic device is provided. The method includes in response to a content being reproduced, acquiring ambient environment information through a sensor module, which is electrically connected to the electronic device, or an external electronic device, determining at least one attribute regarding notification information corresponding to the ambient environment information, and providing the notification information in connection with the content based on the at least one attribute.

Other aspects, advantages, and salient features of the disclosure will become apparent to those skilled in the art from the following detailed description, which, taken in conjunction with the annexed drawings, discloses various embodiments of the present disclosure.

BRIEF DESCRIPTION OF THE DRAWINGS

The above and other aspects, features, and advantages of certain embodiments of the present disclosure will be more apparent from the following description taken in conjunction with the accompanying drawings, in which.

Throughout the drawings, it should be noted that like reference numbers are used to depict the same or similar elements, features, and structures.

DETAILED DESCRIPTION

Figure 1:
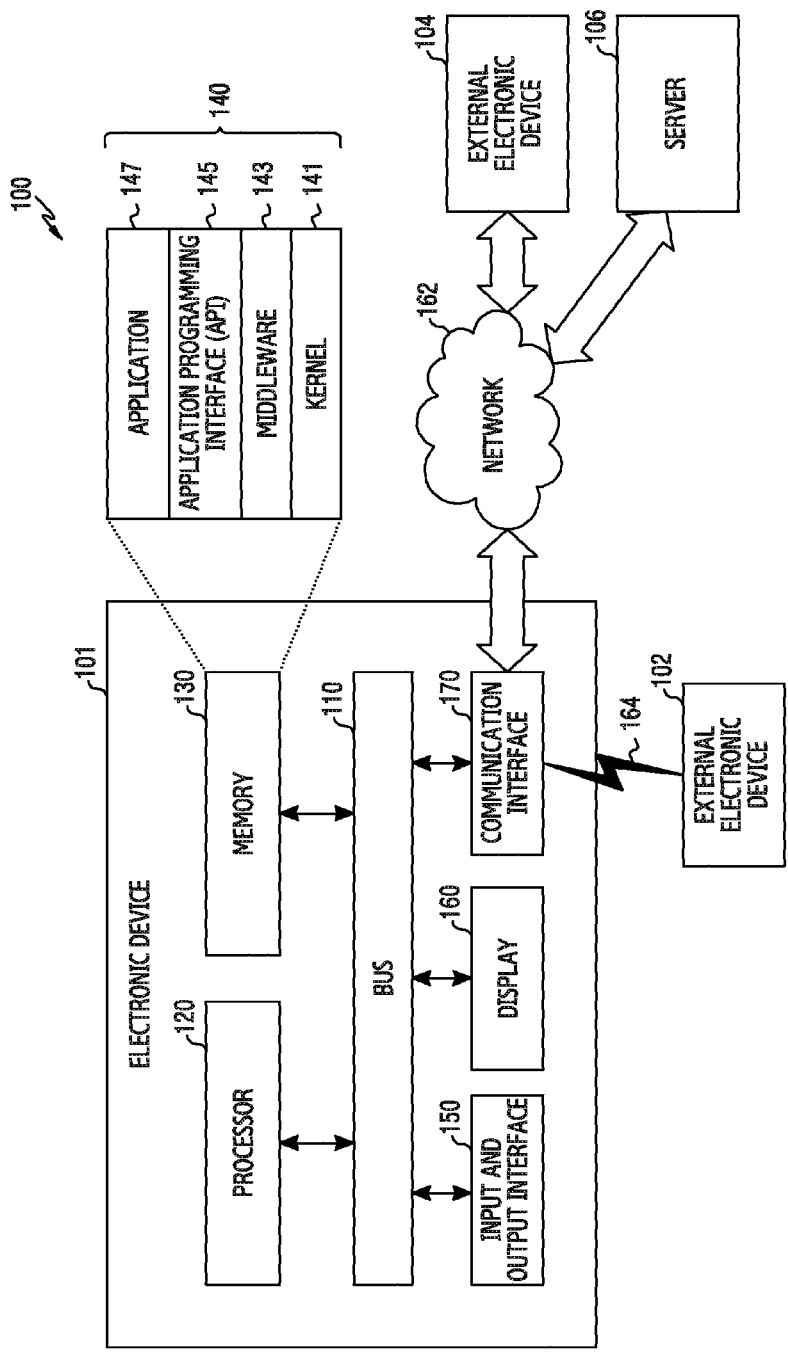
FIG. 1 illustrates a view showing a network environment including an electronic device according to various embodiments of the present disclosure.

The following description with reference to the accompanying drawings is provided to assist in a comprehensive understanding of various embodiments of the present disclosure as defined by the claims and their equivalents. It includes various specific details to assist in that understanding but these are to be regarded as merely exemplary. Accordingly, those of ordinary skill in the art will recognize that various changes and modifications of the various embodiments described herein can be made without departing from the scope and spirit of the present disclosure. In addition, descriptions of well-known functions and constructions may be omitted for clarity and conciseness.

The terms and words used in the following description and claims are not limited to the bibliographical meanings, but, are merely used by the inventor to enable a clear and consistent understanding of the present disclosure. Accordingly, it should be apparent to those skilled in the art that the following description of various embodiments of the present disclosure is provided for illustration purpose only and not for the purpose of limiting the present disclosure as defined by the appended claims and their equivalents.

It is to be understood that the singular forms "a," "an," and "the" include plural referents unless the context clearly dictates otherwise. Thus, for example, reference to "a component surface" includes reference to one or more of such surfaces.

As used herein, the expression "have", "may have", "include", or "may include" refers to the existence of a corresponding feature (e.g., numeral, function, operation, or constituent element such as component), and does not exclude one or more additional features.

In the present disclosure, the expression "A or B", "at least one of A or/and B", or "one or more of A or/and B" may include all possible combinations of the items listed. For example, the expression "A or B", "at least one of A and B", or "at least one of A or B" refers to all of (1) including at least one A, (2) including at least one B, or (3) including all of at least one A and at least one B. The expression "a first", "a second", "the first", or "the second" used in various embodiments of the present disclosure may modify various components regardless of the order and/or the importance but does not limit the corresponding components. For example, a first user device and a second user device indicate different user devices although both of them are user devices. For example, a first element may be termed a second element, and similarly, a second element may be termed a first element without departing from the scope of the present disclosure.

It should be understood that when an element (e.g., first element) is referred to as being (operatively or communicatively) "connected," or "coupled," to another element (e.g., second element), it may be directly connected or coupled directly to the other element or any other element (e.g., third element) may be interposer between them. In contrast, it may be understood that when an element (e.g., first element) is referred to as being "directly connected," or "directly coupled" to another element (second element), there are no element (e.g., third element) interposed between them.

The expression "configured to" used in the present disclosure may be exchanged with, for example, "suitable for", "having the capacity to", "designed to", "adapted to", "made to", or "capable of" according to the situation. The term "configured to" may not necessarily imply "specifically designed to" in hardware. Alternatively, in some situations, the expression "device configured to" may mean that the device, together with other devices or components, "is able to". For example, the phrase "processor adapted (or configured) to perform A, B, and C" may mean a dedicated processor (e.g. embedded processor) only for performing the corresponding operations or a generic-purpose processor (e.g., central processing unit (CPU) or application processor (AP)) that can perform the corresponding operations by executing one or more software programs stored in a memory device.

The terms used in the present disclosure are only used to describe specific embodiments of the present disclosure, and are not intended to limit the present disclosure. As used herein, singular forms may include plural forms as well unless the context clearly indicates otherwise. Unless defined otherwise, all terms used herein, including technical and scientific terms, have the same meaning as those commonly understood by a person skilled in the art to which the present disclosure pertains. Such terms as those defined in a generally used dictionary may be interpreted to have the meanings equal to the contextual meanings in the relevant field of art, and are not to be interpreted to have ideal or excessively formal meanings unless clearly defined in the present disclosure. In some cases, even the term defined in the present disclosure should not be interpreted to exclude embodiments of the present disclosure.

An electronic device according to various embodiments of the present disclosure may include at least one of, for example, a smart phone, a tablet personal computer (PC), a mobile phone, a video phone, an electronic book reader (e-book reader), a desktop PC, a laptop PC, a netbook computer, a workstation, a server, a personal digital assistant (PDA), a Portable Multimedia Player (PMP), a Moving Picture Experts Group phase 1 or phase 2 (MPEG-1 or MPEG-2) audio layer-3 (MP3) player, a mobile medical device, a camera, and a wearable device. According to various embodiments of the present disclosure, the wearable device may include at least one of an accessory type (e.g., a watch, a ring, a bracelet, an anklet, a necklace, a glasses, a contact lens, or a head-mounted device (HMD)), a fabric or clothing integrated type (e.g., an electronic clothing), a body-mounted type (e.g., a skin pad, or tattoo), and a bio-implantable type (e.g., an implantable circuit).

According to various embodiments of the present disclosure, the electronic device may be a home appliance. The home appliance may include at least one of, for example, a television, a digital video disk (DVD) player, an audio, a refrigerator, an air conditioner, a vacuum cleaner, an oven, a microwave oven, a washing machine, an air cleaner, a set-top box, a home automation control panel, a security control panel, a television (TV) box (e.g., Samsung HomeSync™, Apple TV™, or Google TV™), a game console (e.g., Xbox™ and PlayStation™), an electronic dictionary, an electronic key, a camcorder, and an electronic photo frame.

According to another embodiment of the present disclosure, the electronic device may include at least one of various medical devices (e.g., various portable medical measuring devices (a blood glucose monitoring device, a heart rate monitoring device, a blood pressure measuring device, a body temperature measuring device, etc.), a magnetic resonance angiography (MRA), a magnetic resonance imaging (MRI), a computed tomography (CT) machine, and an ultrasonic machine), a navigation device, a global positioning system (GPS) receiver, an event data recorder (EDR), a flight data recorder (FDR), a Vehicle Infotainment Devices, an electronic devices for a ship (e.g., a navigation device for a ship, and a gyro-compass), avionics, security devices, an automotive head unit, a robot for home or industry, an automatic teller's machine (ATM) in banks, point of sales (POS) in a shop, or internet device of things (e.g., a light bulb, various sensors, electric or gas meter, a sprinkler device, a fire alarm, a thermostat, a streetlamp, a toaster, a sporting goods, a hot water tank, a heater, a boiler, etc.).

According to various embodiments of the present disclosure, the electronic device may include at least one of a part of furniture or a building/structure, an electronic board, an electronic signature receiving device, a projector, and various kinds of measuring instruments (e.g., a water meter, an electric meter, a gas meter, and a radio wave meter). The electronic device according to various embodiments of the present disclosure may be a combination of one or more of the aforementioned various devices. The electronic device according to some embodiments of the present disclosure may be a flexible device. Further, the electronic device according to an embodiment of the present disclosure is not limited to the aforementioned devices, and may include a new electronic device according to the development of technology.

Hereinafter, an electronic device according to various embodiments will be described with reference to the accompanying drawings. As used herein, the term "user" may indicate a person who uses an electronic device or a device (e.g., an artificial intelligence electronic device) that uses an electronic device.

FIG. 1 illustrates a network environment including an electronic device according to various embodiments of the present disclosure.

Referring to FIG. 1, an electronic device 101 within a network environment 100, according to various embodiments of the present disclosure, will be described with reference to FIG. 1. The electronic device 101 may include a bus 110, a processor 120, a memory 130, an input/output interface 150, a display 160, and a communication interface 170. According to an embodiment of the present disclosure, the electronic device 101 may omit at least one of the above components or may further include other components.

The bus 110 may include, for example, a circuit which interconnects the components 110 to 170 and delivers a communication (e.g., a control message and/or data) between the components 110 to 170.

The processor 120 may include one or more of a CPU, an AP, and a communication processor (CP). The processor 120 may carry out, for example, calculation or data processing relating to control and/or communication of at least one other component of the electronic device 101.

The memory 130 may include a volatile memory and/or a non-volatile memory. The memory 130 may store, for example, commands or data relevant to at least one other component of the electronic device 101. According to an embodiment of the present disclosure, the memory 130 may store software and/or a program 140. The program 140 may include, for example, a kernel 141, middleware 143, an application programming interface (API) 145, and/or application programs (or "applications") 147. At least some of the kernel 141, the middleware 143, and the API 145 may be referred to as an operating system (OS).

The kernel 141 may control or manage system resources (e.g., the bus 110, the processor 120, or the memory 130) used for performing an operation or function implemented in the other programs (e.g., the middleware 143, the API 145, or the application programs 147). Furthermore, the kernel 141 may provide an interface through which the middleware 143, the API 145, or the application programs 147 may access the individual components of the electronic device 101 to control or manage the system resources.

The middleware 143, for example, may serve as an intermediary for allowing the API 145 or the application programs 147 to communicate with the kernel 141 to exchange data.

Also, the middleware 143 may process one or more task requests received from the application programs 147 according to priorities thereof For example, the middleware 143 may assign priorities for using the system resources (e.g., the bus 110, the processor 120, the memory 130, or the like) of the electronic device 101, to at least one of the application programs 147. For example, the middleware 143 may perform scheduling or loading balancing on the one or more task requests by processing the one or more task requests according to the priorities assigned thereto.

The API 145 is an interface through which the applications 147 control functions provided from the kernel 141 or the middleware 143, and may include, for example, at least one interface or function (e.g., instruction) for file control, window control, image processing, character control, and the like.

The input/output interface 150, for example, may function as an interface that may transfer commands or data input from a user or another external device to the other element(s) of the electronic device 101. Furthermore, the input/output interface 150 may output the commands or data received from the other element(s) of the electronic device 101 to the user or another external device.

Examples of the display 160 may include a liquid crystal display (LCD), a light-emitting diode (LED) display, an organic light-emitting diode (OLED) display, a microelectromechanical Systems (MEMS) display, and an electronic paper display. The display 160 may display, for example, various types of contents (e.g., text, images, videos, icons, or symbols) to users. The display 160 may include a touch screen, and may receive, for example, a touch, gesture, proximity, or hovering input using an electronic pen or a user's body part.

The communication interface 170 may establish communication, for example, between the electronic device 101 and an external device (e.g., a first external electronic device 102, a second external electronic device 104, or a server 106). For example, the communication interface 170 may be connected to a network 162 through wireless or wired communication, and may communicate with an external device (e.g., the second external electronic device 104 or the server 106). The wireless communication may use at least one of, for example, long term evolution (LTE), LTE-advance (LTE-A), code division multiple access (CDMA), wideband CDMA (WCDMA), universal mobile telecommunications system (UMTS), wireless broadband (WiBro), and global system for mobile communications (GSM), as a cellular communication protocol. In addition, the wireless communication may include, for example, short range communication 164. The short-range communication 164 may include at least one of, for example, Wi-Fi, Bluetooth, near field communication (NFC), and global navigation satellite system (GNSS). GNSS may include, for example, at least one of GPS, global navigation satellite system (Glonass), Beidou Navigation satellite system (Beidou) or Galileo, and the European global satellite-based navigation system, based on a location, a bandwidth, or the like. Hereinafter, in the present disclosure, the "GPS" may be interchangeably used with the "GNSS". The wired communication may include, for example, at least one of a universal serial bus (USB), a high definition multimedia interface (HDMI), recommended standard 232 (RS-232), and a plain old telephone service (POTS). The network 162 may include at least one of a telecommunication network such as a computer network (e.g., a local area network (LAN) or a wide area network (WAN)), the Internet, and a telephone network.

Each of the first and second external electronic devices 102 and 104 may be of a type identical to or different from that of the electronic device 101. According to an embodiment of the present disclosure, the server 106 may include a group of one or more servers. According to various embodiments of the present disclosure, all or some of the operations performed in the electronic device 101 may be executed in another electronic device or a plurality of electronic devices (e.g., the electronic devices 102 and 104 or the server 106). According to an embodiment of the present disclosure, when the electronic device 101 has to perform some functions or services automatically or in response to a request, the electronic device 101 may request another device (e.g., the electronic device 102 or 104 or the server 106) to execute at least some functions relating thereto instead of or in addition to autonomously performing the functions or services. Another electronic device (e.g., the electronic device 102 or 104, or the server 106) may execute the requested functions or the additional functions, and may deliver a result of the execution to the electronic device 101. The electronic device 101 may process the received result as it is or additionally, and may provide the requested functions or services. To this end, for example, cloud computing, distributed computing, or client-server computing technologies may be used.

Figure 2:
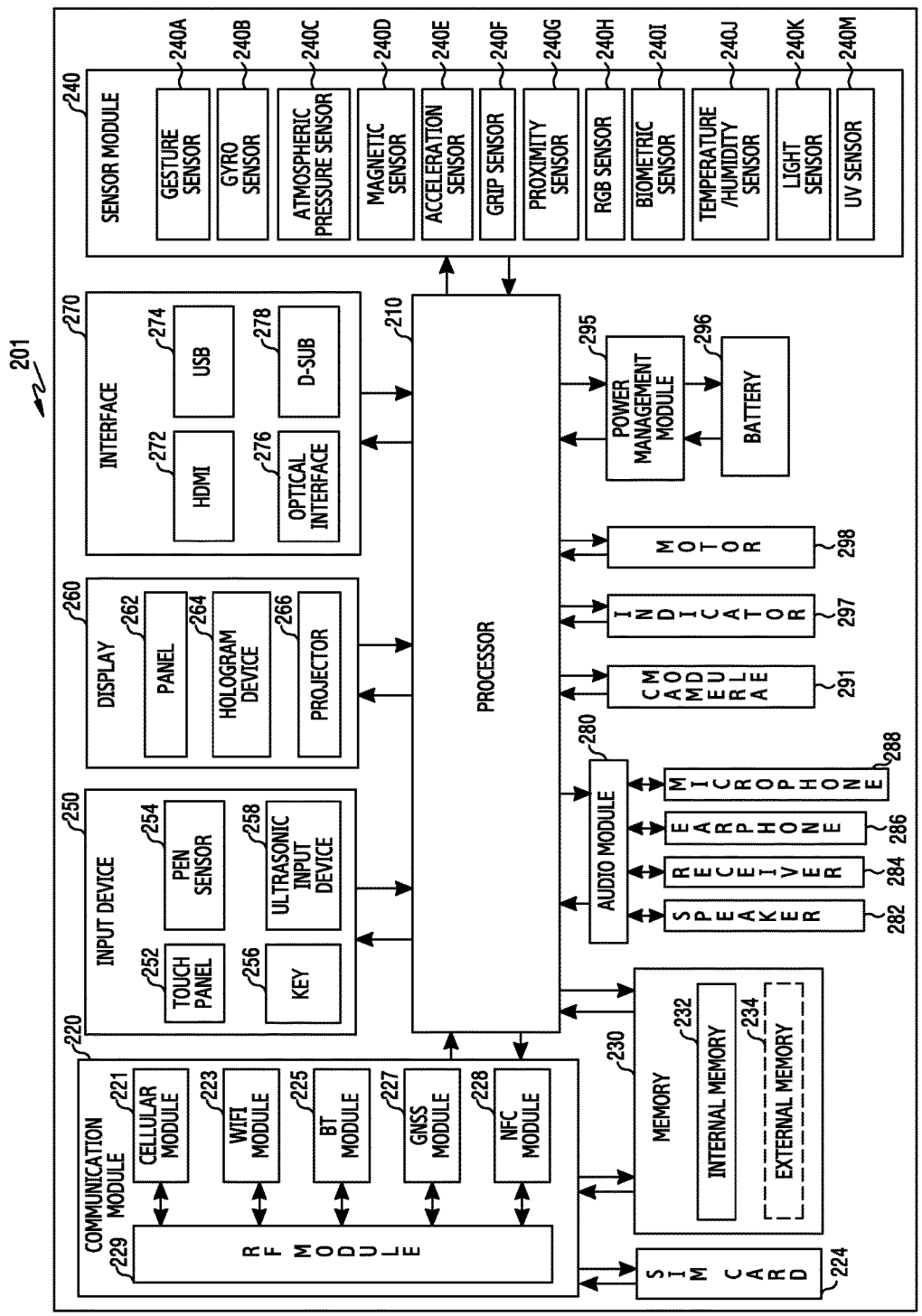
FIG. 2 illustrates a block diagram showing an electronic device according to various embodiments of the present disclosure.

FIG. 2 is a block diagram of an electronic device according to various embodiments of the present disclosure.

Referring to FIG. 2, the electronic device 201 may include, for example, all or a part of the electronic device 101 shown in FIG. 1. The electronic device 201 may include one or more processors 210 (e.g., AP), a communication module 220, a memory 230, a sensor module 240, an input device 250, a display 260, an interface 270, an audio module 280, a camera module 291, a power management module 295, a battery 296, an indicator 297, and a motor 298.

The processor 210 may control a plurality of hardware or software components connected to the processor 210 by driving an OS or an application program, and perform processing of various pieces of data and calculations. The processor 210 may be embodied as, for example, a system on chip (SoC). According to an embodiment of the present disclosure, the processor 210 may further include a graphic processing unit (GPU) and/or an image signal processor (ISP). The processor 210 may include at least some (for example, a cellular module 221) of the components illustrated in FIG. 2. The processor 210 may load, into a volatile memory, commands or data received from at least one (e.g., a non-volatile memory) of the other components and may process the loaded commands or data, and may store various data in a non-volatile memory.

The communication module 220 may have a configuration equal or similar to that of the communication interface 170 of FIG. 1. The communication module 220 may include, for example, a cellular module 221, a Wi-Fi module 223, a BT module 225, a GNSS module 227 (e.g., a GPS module, a Glonass module, a Beidou module, or a Galileo module), an NFC module 228, and a radio frequency (RF) module 229.

The cellular module 221, for example, may provide a voice call, a video call, a text message service, or an Internet service through a communication network. According to an embodiment of the present disclosure, the cellular module 221 may distinguish and authenticate the electronic device 201 in a communication network using a subscriber identification module (SIM) (e.g.: SIM card) 224 (for example, the SIM card).

According to an embodiment of the present disclosure, the cellular module 221 may perform at least some of the functions that the AP 210 may provide. According to an embodiment of the present disclosure, the cellular module 221 may include a CP.

For example, each of the Wi-Fi module 223, the BT module 225, the GNSS module 227, and the NFC module 228 may include a processor for processing data transmitted/received through a corresponding module. According to an embodiment of the present disclosure, at least some (e.g., two or more) of the cellular module 221, the Wi-Fi module 223, the BT module 225, the GNSS module 227, and the NFC module 228 may be included in one integrated chip (IC) or IC package.

The RF module 229, for example, may transmit/receive a communication signal (e.g., an RF signal). The RF module 229 may include, for example, a transceiver, a power amplifier module (PAM), a frequency filter, a low noise amplifier (LNA), and an antenna. According to another embodiment of the present disclosure, at least one of the cellular module 221, the Wi-Fi module 223, the BT module 225, the GNSS module 227, and the NFC module 228 may transmit/receive an RF signal through a separate RF module.

The SIM 224 may include, for example, a card including a subscriber identity module and/or an embedded SIM, and may contain unique identification information (e.g., an integrated circuit card identifier (ICCID)) or subscriber information (e.g., an international mobile subscriber identity (IMSI)).

The memory 230 (e.g., the memory 130) may include, for example, an internal memory 232 or an external memory 234. The internal memory 232 may include at least one of a volatile memory (e.g., a dynamic random access memory (DRAM), a static RAM (SRAM), a synchronous dynamic RAM (SDRAM), and the like) and a non-volatile memory (e.g., a one time programmable read only memory (OTPROM), a programmable ROM (PROM), an erasable and programmable ROM (EPROM), an electrically erasable and programmable ROM (EEPROM), a mask ROM, a flash ROM, a flash memory (e.g., a NAND flash memory or a NOR flash memory), a hard disc drive, a Solid State Drive (SSD), and the like).

The external memory 234 may further include a flash drive, for example, a compact flash (CF), a secure digital (SD), a micro-SD, a mini-SD, an eXtreme Digital (xD), a multimediacard (MMC), a memory stick, or the like. The external memory 234 may be functionally and/or physically connected to the electronic device 201 through various interfaces.

The sensor module 240, for example, may measure a physical quantity or detect an operation state of the electronic device 201, and may convert the measured or detected information into an electrical signal. The sensor module 240 may include, for example, at least one of a gesture sensor 240A, a gyro sensor 240B, an atmospheric pressure sensor (barometer) 240C, a magnetic sensor 240D, an acceleration sensor 240E, a grip sensor 240F, a proximity sensor 240G, a color sensor 240H (e.g., red, green, and blue (RGB) sensor), a biometric sensor (medical sensor) 240I, a temperature/humidity sensor 240J, an illuminance (light) sensor 240K, and a ultra violet (UV) sensor 240M. Additionally or alternatively, the sensor module 240 may include, for example, an E-nose sensor, an electromyography (EMG) sensor, an electroencephalogram (EEG) sensor, an electrocardiogram (ECG) sensor, an infrared (IR) sensor, an iris scan sensor, and/or a finger scan sensor. The sensor module 240 may further include a control circuit for controlling one or more sensors included therein. According to an embodiment of the present disclosure, the electronic device 201 may further include a processor configured to control the sensor module 240, as a part of the processor 210 or separately from the processor 210, and may control the sensor module 240 while the processor 210 is in a sleep state.

The input device 250 may include, for example, a touch panel 252, a (digital) pen sensor 254, a key 256, or an ultrasonic input device 258. The touch panel 252 may use, for example, at least one of a capacitive type, a resistive type, an infrared type, and an ultrasonic type. The touch panel 252 may further include a control circuit. The touch panel 252 may further include a tactile layer, and provide a tactile reaction to the user.

The (digital) pen sensor 254 may include, for example, a recognition sheet which is a part of the touch panel or is separated from the touch panel. The key 256 may include, for example, a physical button, an optical key or a keypad. The ultrasonic input device 258 may detect, through a microphone (e.g., the microphone 288), ultrasonic waves generated by an input tool, and identify data corresponding to the detected ultrasonic waves.

The display 260 (e.g., the display 160) may include a panel 262, a hologram device 264, or a projector 266. The panel 262 may include a configuration identical or similar to the display 160 illustrated in FIG. 1. The panel 262 may be implemented to be, for example, flexible, transparent, or wearable. The panel 262 may be embodied as a single module with the touch panel 252. The hologram device 264 may show a three-dimensional (3D) image in the air by using an interference of light. The projector 266 may project light onto a screen to display an image. The screen may be located, for example, in the interior of or on the exterior of the electronic device 201. According to an embodiment of the present disclosure, the display 260 may further include a control circuit for controlling the panel 262, the hologram device 264, or the projector 266.

The interface 270 may include, for example, an HDMI 272, a USB 274, an optical interface 276, or a D-subminiature (D-sub) 278. The interface 270 may be included in, for example, the communication interface 170 illustrated in FIG. 1. Additionally or alternatively, the interface 270 may include, for example, a mobile high-definition link (MHL) interface, an SD card/Multi-Media Card (MMC) interface, or an Infrared Data Association (IrDA) standard interface.

The audio module 280, for example, may bilaterally convert a sound and an electrical signal. At least some components of the audio module 280 may be included in, for example, the input/output interface 150 illustrated in FIG. 1. The audio module 280 may process voice information input or output through, for example, a speaker 282, a receiver 284, earphones 286, or the microphone 288.

The camera module 291 is, for example, a device which may photograph a still image and a video. According to an embodiment of the present disclosure, the camera module 291 may include one or more image sensors (e.g., a front sensor or a back sensor), a lens, an ISP or a flash (e.g., LED or xenon lamp).

The power management module 295 may manage, for example, power of the electronic device 201. According to an embodiment of the present disclosure, the power management module 295 may include a power management integrated circuit (PMIC), a charger integrated circuit (IC), or a battery or fuel gauge. The PMIC may use a wired and/or wireless charging method. Examples of the wireless charging method may include, for example, a magnetic resonance method, a magnetic induction method, an electromagnetic wave method, and the like. Additional circuits (e.g., a coil loop, a resonance circuit, a rectifier, etc.) for wireless charging may be further included. The battery gauge may measure, for example, a residual quantity of the battery 296, and a voltage, a current, or a temperature while charging. The battery 296 may include, for example, a rechargeable battery and/or a solar battery.

The indicator 297 may display a particular state (e.g., a booting state, a message state, a charging state, or the like) of the electronic device 201 or a part (e.g., the processor 210) of the electronic device 201. The motor 298 may convert an electrical signal into a mechanical vibration, and may generate a vibration, a haptic effect, or the like. Although not illustrated, the electronic device 201 may include a processing device (e.g., a GPU) for supporting a mobile TV. The processing device for supporting a mobile TV may process, for example, media data according to a certain standard such as digital multimedia broadcasting (DMB), digital video broadcasting (DVB), or mediaFLOTM.

Each of the above-described component elements of hardware according to the present disclosure may be configured with one or more components, and the names of the corresponding component elements may vary based on the type of electronic device. In various embodiments of the present disclosure, the electronic device may include at least one of the above-described elements. Some of the above-described elements may be omitted from the electronic device, or the electronic device may further include additional elements. Also, some of the hardware components according to various embodiments may be combined into one entity, which may perform functions identical to those of the relevant components before the combination.

Figure 3:
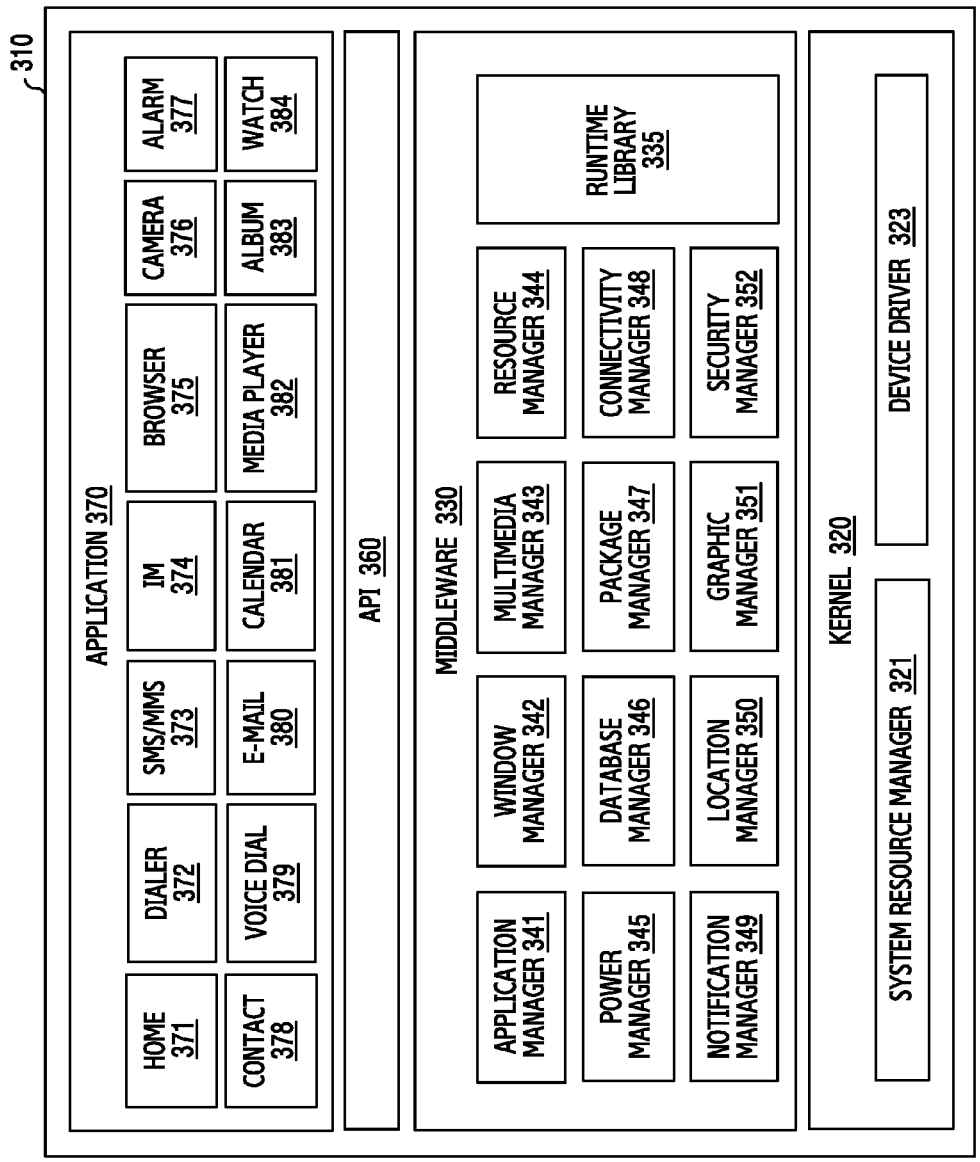
FIG. 3 illustrates a block diagram showing a program module according to various embodiments of the present disclosure.

FIG. 3 is a block diagram of a program module according to various embodiments of the present disclosure.

Referring to FIG. 3, the program module 310 (e.g., the program 140) may include an OS for controlling resources related to the electronic device (e.g., the electronic device 101) and/or various applications (e.g., the application programs 147) executed in the OS. The OS may be, for example, Android™, iOS™, Windows™, Symbian™, Tizen™, Bada™, or the like.

The program module 310 may include a kernel 320, middleware 330, an API 360, and/or applications 370. At least some of the program module 310 may be preloaded on an electronic device, or may be downloaded from an external electronic device (e.g., the electronic device 102 or 104, or the server 106).

The kernel 320 (e.g., the kernel 141) may include, for example, a system resource manager 321 and/or a device driver 323. The system resource manager 321 may control, allocate, or collect system resources. According to an embodiment of the present disclosure, the system resource manager 321 may include a process management unit, a memory management unit, a file system management unit, and the like. The device driver 323 may include, for example, a display driver, a camera driver, a Bluetooth driver, a shared memory driver, a USB driver, a keypad driver, a Wi-Fi driver, an audio driver, or an inter-process communication (IPC) driver.

For example, the middleware 330 may provide a function required in common by the applications 370, or may provide various functions to the applications 370 through the API 360 so as to enable the applications 370 to efficiently use the limited system resources in the electronic device. According to an embodiment of the present disclosure, the middleware 330 (e.g., the middleware 143) may include at least one of a run time library 335, an application manager 341, a window manager 342, a multimedia manager 343, a resource manager 344, a power manager 345, a database manager 346, a package manager 347, a connectivity manager 348, a notification manager 349, a location manager 350, a graphic manager 351, and a security manager 352.

The runtime library 335 may include a library module that a compiler uses in order to add a new function through a programming language while an application 370 is being executed. The runtime library 335 may perform input/output management, memory management, the functionality for an arithmetic function, or the like.

The application manager 341 may manage, for example, a life cycle of at least one of the applications 370. The window manager 342 may manage graphical user interface (GUI) resources used by a screen. The multimedia manager 343 may recognize a format required for reproduction of various media files, and may perform encoding or decoding of a media file by using a codec suitable for the corresponding format. The resource manager 344 may manage resources of a source code, a memory, and a storage space of at least one of the applications 370.

The power manager 345 may operate together with, for example, a basic input/output system (BIOS) or the like to manage a battery or power source and may provide power information or the like required for the operations of the electronic device. The database manager 346 may generate, search for, and/or change a database to be used by at least one of the applications 370. The package manager 347 may manage installation or an update of an application distributed in a form of a package file.

For example, the connectivity manager 348 may manage wireless connectivity such as Wi-Fi or Bluetooth. The notification manager 349 may display or notify of an event such as an arrival message, promise, proximity notification, and the like in such a way that does not disturb a user. The location manager 350 may manage location information of an electronic device. The graphic manager 351 may manage a graphic effect which will be provided to a user, or a user interface related to the graphic effect. The security manager 352 may provide all security functions required for system security, user authentication, or the like. According to an embodiment of the present disclosure, when the electronic device (e.g., the electronic device 101) has a telephone call function, the middleware 330 may further include a telephony manager for managing a voice call function or a video call function of the electronic device.

The middleware 330 may include a middleware module that forms a combination of various functions of the above-described components. The middleware 330 may provide a module specialized for each type of OS in order to provide a differentiated function. Further, the middleware 330 may dynamically remove some of the existing components or add new components.

The API 360 (e.g., the API 145) is, for example, a set of API programming functions, and may be provided with a different configuration according to an OS. For example, in the case of Android or iOS, one API set may be provided for each platform. In the case of Tizen, two or more API sets may be provided for each platform.

The applications 370 (e.g., the application programs 147) may include, for example, one or more applications which may provide functions such as a home 371, a dialer 372, a short message service (SMS)/multimedia message service (MMS) 373, an instant message (IM) 374, a browser 375, a camera 376, an alarm 377, contacts 378, a voice dial 379, an email 380, a calendar 381, a media player 382, an album 383, a clock (watch) 384, health care (e.g., measuring exercise quantity or blood sugar), or environment information (e.g., providing atmospheric pressure, humidity, or temperature information).

According to an embodiment of the present disclosure, the applications 370 may include an application (hereinafter, referred to as an "information exchange application" for convenience of description) that supports exchanging information between the electronic device (e.g., the electronic device 101) and an external electronic device (e.g., the electronic device 102 or 104). The information exchange application may include, for example, a notification relay application for transferring specific information to an external electronic device or a device management application for managing an external electronic device.

For example, the notification relay application may include a function of transferring, to the external electronic device (e.g., the electronic device 102 or 104), notification information generated from other applications of the electronic device 101 (e.g., an SMS/MMS application, an e-mail application, a health management application, or an environmental information application). Further, the notification relay application may receive notification information from, for example, an external electronic device and provide the received notification information to a user.

The device management application may manage (e.g., install, delete, or update), for example, at least one function of an external electronic device (e.g., the electronic device 102 or 104) communicating with the electronic device (e.g., a function of turning on/off the external electronic device itself (or some components) or a function of adjusting the brightness (or a resolution) of the display), applications operating in the external electronic device, and services provided by the external electronic device (e.g., a call service or a message service).

According to an embodiment of the present disclosure, the applications 370 may include applications (e.g., a health care application of a mobile medical appliance or the like) designated according to an external electronic device (e.g., attributes of the electronic device 102 or 104). According to an embodiment of the present disclosure, the applications 370 may include an application received from an external electronic device (e.g., the server 106, or the electronic device 102 or 104). According to an embodiment of the present disclosure, the applications 370 may include a preloaded application or a third party application that may be downloaded from a server. The names of the components of the program module 310 of the illustrated embodiment of the present disclosure may change according to the type of OS.

According to various embodiments of the present disclosure, at least a part of the programming module 310 may be implemented in software, firmware, hardware, or a combination of two or more thereof At least some of the program module 310 may be implemented (e.g., executed) by, for example, the processor (e.g., the processor 210). At least some of the program module 310 may include, for example, a module, a program, a routine, a set of instructions, and/or a process for performing one or more functions.

Figure 4A:
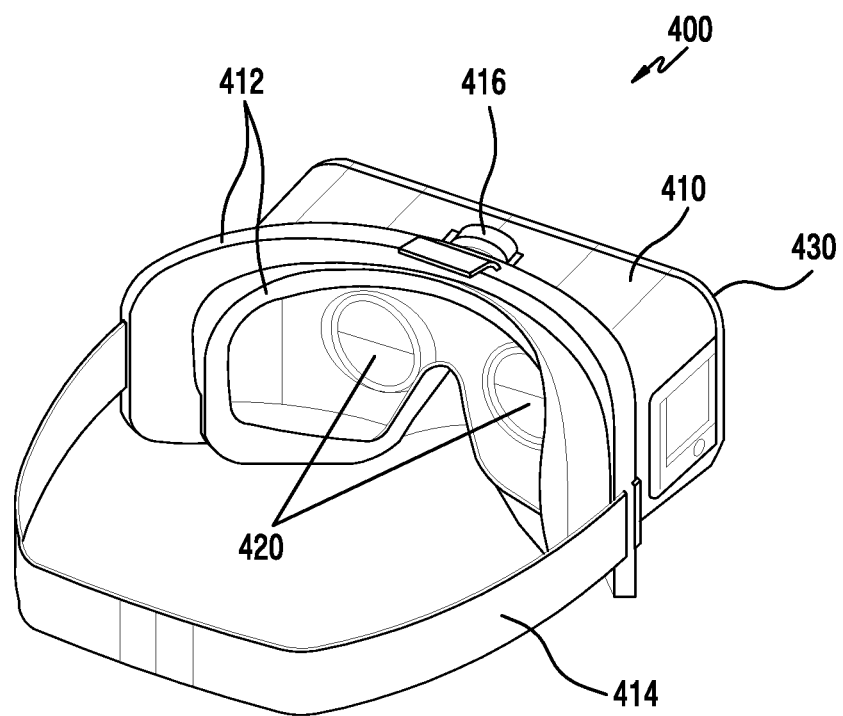
FIGS. 4A and 4B illustrate views showing a configuration of a body-mounted electronic device according to various embodiments of the present disclosure.
Figure 4B:
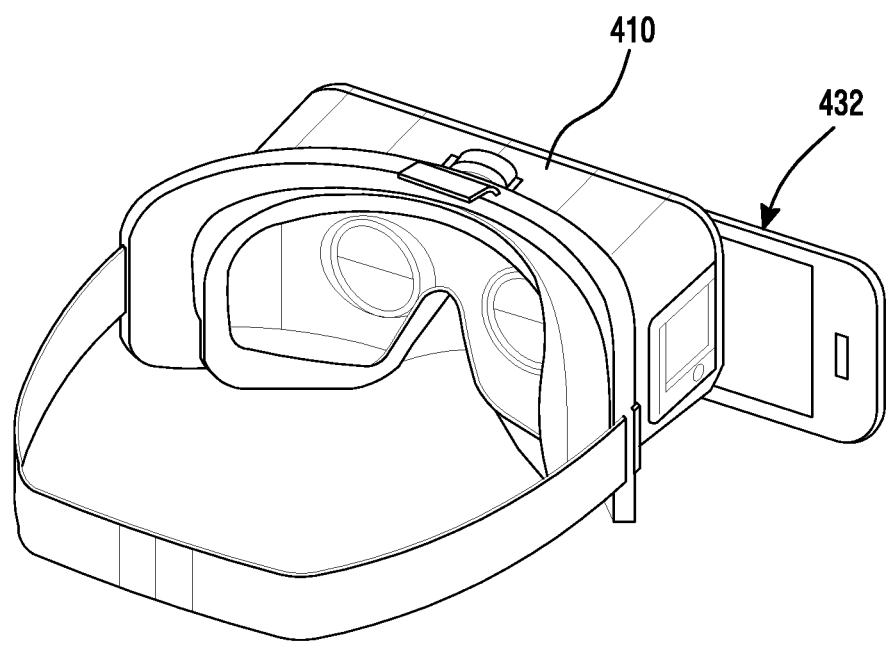

FIGS. 4A and 4B illustrate views showing a configuration of a body-mounted electronic device (for example, the electronic device 101 or 201) according to an embodiment of the present disclosure.

Referring to FIG. 4A, the body-mounted electronic device 400 (for example, an HMD) may include a frame 410, a wearing part 412, a band part 414, an optical part 420, and a display 430.

The frame 410 may functionally or physically connect the elements (for example, the optical part 420, the display 430, and at least one control module (not shown)) of the body-mounted electronic device 400. For example, the frame 410 may have at least some areas formed in a curved shape based on a face shape so that the user can wear the body-mounted electronic device 400.

According to an embodiment of the present disclosure, the frame 410 may include a focal point adjusting module (adjustable optics) 416 to allow the user to adjust a focal point of the display 430. For example, the focal point adjusting module 416 may adjust a user's focal point by adjusting at least one of a location of a lens or a location of the display 430 in order for the user to enjoy an image suitable to user's sight.

The wearing part 412 may be in contact with a part of the user's body. For example, the wearing part 412 may bring the frame 410 into close contact with the periphery of user's eyes using a band which is formed of elastic material.

The band part 414 may be formed of elastic material such as rubber and may have both ends connected with each other at the back of user's head using a hook formed at the end thereof.

The optical part 420 may be configured for the user to identify an image displayed on the display 430. For example, the optical part 420 may include a lens, a body tube, and an aperture in order for the user to identify the image displayed on the display 430.

The display 430 may display a variety of information (for example, multimedia data, text data, etc.) for the user. For example, the display 430 may display a right-eye image and a left-eye image corresponding to user's both eyes to make the user feel a sense of depth.

According to various embodiments of the present disclosure, the display 430 of the HMD may include an inputting means for receiving an input of a user's control command and an outputting means (for example, a speaker) for outputting audio data although they are not illustrated. Herein, the inputting means may include an input interface, a microphone, a camera, an ultrasonic sensor, etc.

Referring to FIG. 4B, the body-mounted electronic device 400 may be electrically connected to an electronic device 432 to use the electronic device 432 as the display 430.

When the electronic device 432 is used as the display 430 of the body-mounted electronic device 400, the frame 410 may be configured to include a docking space on which the electronic device 432 is docked. For example, the frame 410 may use elastic material or include the docking space which can have its size structurally changed to connect the electronic device 432 with the body-mounted electronic device 400 regardless of the size of the electronic device 432. Herein, the electronic device 432 may include a portable electronic device which can display information through a display, such as a smart phone, a tablet PC, etc.

According to various embodiments of the present disclosure, the body-mounted electronic device 400 may be connected with the electronic device 432 mounted in the docking space of the frame 410 using a USB or wire communication serving to perform a similar function to the USB, or wireless communication such as a wireless LAN (for example, Wi-Fi, Wi-Fi Direct) or Bluetooth.

Figure 5:
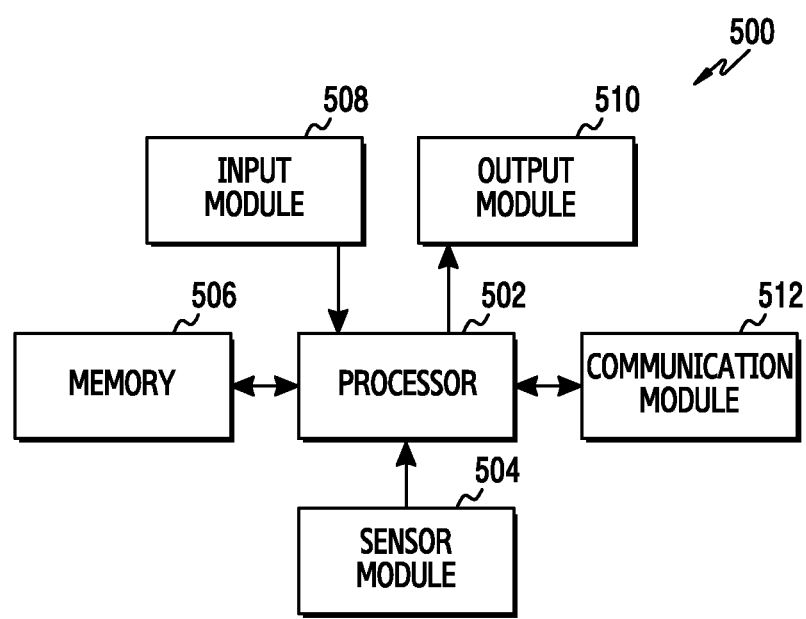
FIG. 5 illustrates a block diagram showing an electronic device according to various embodiments of the present disclosure.

FIG. 5 illustrates a block diagram showing an electronic device 500 according to various embodiments of the present disclosure. In the following description, the electronic device may refer to at least one of the body-mounted electronic device 400 of FIG. 4A or the electronic device 432 electrically connected to the body-mounted electronic device 400 shown in FIG. 4B.

Referring to FIG. 5, the electronic device 500 may include a processor 502, a sensor module 504, a memory 506, an input module 508, and an output module 510.

The processor 502 may reproduce a content. For example, the processor 502 may control the output module 510 to output at least one of video data or audio data corresponding to the reproduced content.

According to an embodiment of the present disclosure, the processor 502 may detect generation of a notification event based on ambient environment information which is collected through at least one of the sensor module 504 and the communication module 512. For example, the processor 502 may determine whether a notification event is generated or not by comparing ambient environment information detected through the sensor module 504 and a notification event detection variable stored in the memory 506. For example, the processor 502 may determine whether a notification event is generated or not by comparing ambient environment information received from an external electronic device through the communication module 512 and the notification event detection variable stored in the memory 506. For example, the processor 502 may determine that the notification event is generated when ambient environment information is received from an external electronic device through the communication module 512. For example, the processor 502 may collect ambient environment information of the electronic device 500 by activating at least one of the sensor module 504 and the communication module 502 in response to the content being reproduced. Herein, the ambient environment information may include at least one of an ambient image, an ambient sound, a motion of an ambient object, an ambient smell, ambient temperature/humidity, ambient lighting, ambient ultraviolet rays, and information related to the external electronic device. The notification event detection variable may be data which is pre-defined to detect a notification event, and may be pre-stored in the memory 500 or received from an external server. The processor 502 may add, delete, or change the notification event detection variable based on input information received through the input module 508.

According to an embodiment of the present disclosure, when the processor 502 detects the generation of the notification event, the processor 502 may determine an attribute regarding notification information corresponding to the notification event. For example, the processor 502 may determine a notification output variable based on at least one of a characteristic of the content, the notification event, an attribute of the electronic device 500, or an attribute of the external electronic device. Herein, the characteristic of the content may include reproduction information (for example, a type of sound and a volume) of the content at a time corresponding to the generation of the notification event. The notification output variable may include at least one of an output time of the notification information or an output volume of the notification information.

The sensor module 504 may detect motion information of the electronic device 500 and ambient environment information of the electronic device. For example, the sensor module 504 may include a microphone sensor, a camera sensor, an ultrasonic sensor, a gyro sensor, an acceleration sensor, a geomagnetic sensor, an olfactory sensor, a proximity sensor, a temperature/humidity sensor, an illuminance sensor, a UV sensor, etc. For example, the sensor module 504 may further include a control circuit to control at least one sensor included in the sensor module 504.

The memory 506 may store a command or data to drive the electronic device. For example, the memory 506 may store at least one of the notification event detection variable, the notification information corresponding to the notification event, and the attribute regarding the notification information. Herein, the notification event detection variable may include reference data to be compared with the ambient environment information to detect the generation of the notification event.

The input module 508 may transmit a command or data for controlling the operation of the electronic device, which is inputted by the user or from another external device, to other element(s) of the electronic device. For example, the input module 508 may include a key pad, a dome switch, a physical button, a touch pad (resistive type/capacitive type), a jog and shuttle, etc. In this case, the input module 508 may be combined with the output module 510 to be implemented as a touch screen.

The output module 510 may output various contents to the user. Herein, the content may include an audio, a text, an image, a video, an icon, a symbol, etc.

According to an embodiment of the present disclosure, the output module 510 may output the notification information corresponding to the generation of the notification event while the content is being reproduced. For example, the output module 510 may mix audio data of the content and the notification information (for example, a notification sound) corresponding to the notification event, and output the content.

The communication module 512 may establish communication between the electronic device 500 and an external electronic device (for example, an Internet of things (IoT) device). For example, the communication module 512 may communicate with the external electronic device through wireless communication. For example, the wireless communication may include short-distance communication or cellular communication. The short-distance communication may include at least one of Wi-Fi, Bluetooth, and NFC. The cellular communication may include at least one of LTE, LTE-A, CDMA, WCDMA, UMTS, WiBro, GSM, etc.

According to various embodiments of the present disclosure, the electronic device may include a sensor module, a memory, and a processor electrically connected to the sensor module and the memory. The processor may be configured to reproduce a content, acquire ambient environment information on the electronic device through a sensor module, or an external electronic device, determine at least one attribute regarding notification information corresponding to the ambient environment information, and provide the notification information in connection with the content based on the at least one attribute.

According to various embodiments of the present disclosure, the ambient environment information may include information corresponding to a designated event.

According to various embodiments of the present disclosure, the processor may be configured to provide additional information which is acquired from the external electronic device or an attribute regarding the external electronic device in connection with the notification information.

According to various embodiments of the present disclosure, the ambient environment information may include at least one of an ambient sound, an ambient image, a motion of an ambient object, an ambient smell, ambient temperature/humidity, ambient lighting, ambient ultraviolet rays, or operation situation information of the external electronic device.

According to various embodiments of the present disclosure, the notification information may include at least one of ambient environment information, pre-stored notification data, or notification data which is received from the external electronic device.

According to various embodiments of the present disclosure, the at least one attribute regarding the notification information may include at least one of an output time of the notification information and an output volume of the notification information.

According to various embodiments of the present disclosure, the processor may be configured to detect similarity between the content corresponding to a time when the ambient environment information is acquired, and the notification information corresponding to the ambient environment information, and determine the output time of the notification information based on the similarity.

According to various embodiments of the present disclosure, the processor may be configured to compare the content corresponding to a time when the ambient environment information is acquired and an output volume of the notification information corresponding to the ambient environment information, and adjust a ratio between an output volume of the content and the output volume of the notification information based on a result of the comparing.

According to various embodiments of the present disclosure, the processor may be configured to detect similarity between the content corresponding to a time when the ambient environment information is acquired and the notification information corresponding to the ambient environment information, and adjust a ratio between an output volume of the content and the output volume of the notification information based on the similarity.

According to various embodiments of the present disclosure, the processor may be configured to determine whether an input confirming the notification information is detected through the sensor module, and, when the input confirming the notification information is not detected, adjust a ratio between an output volume of audio data of the content and an output volume of the notification information.

Figure 6:
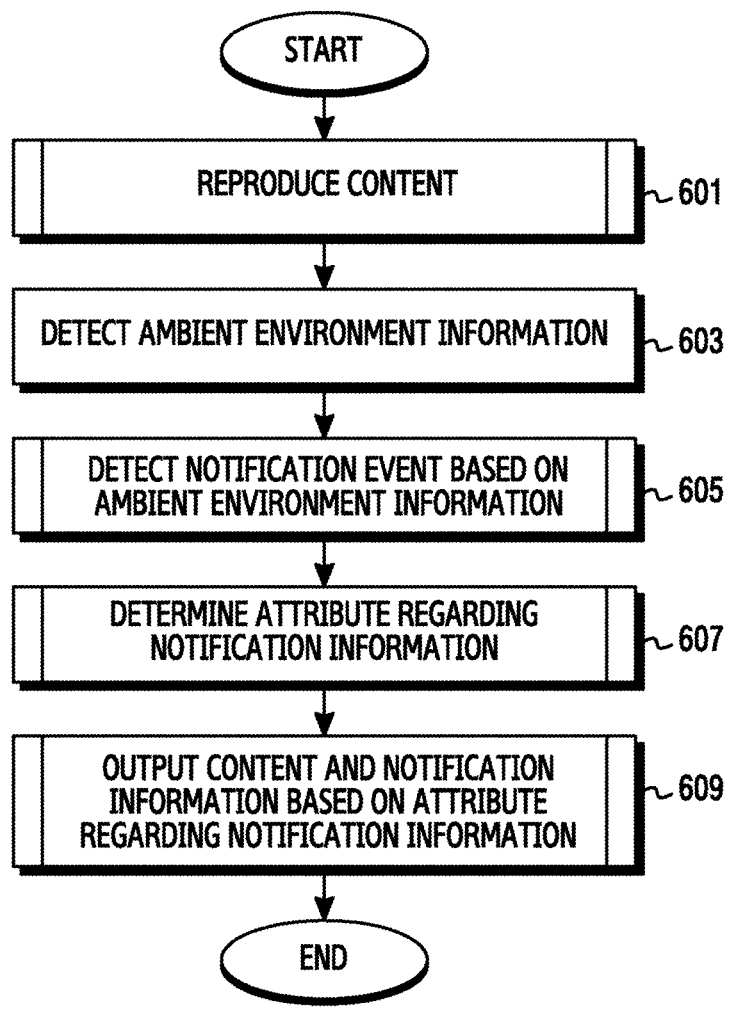
FIG. 6 illustrates a flowchart for outputting a content and notification information in an electronic device according to various embodiments of the present disclosure.

FIG. 6 illustrates a flowchart for outputting a content and notification information based on an attribute regarding the notification information in an electronic device according to various embodiments of the present disclosure.

Referring to FIG. 6, in operation 601, the electronic device (for example, the electronic device 101, 201 or 500) may reproduce a content. For example, the processor 502 of the electronic device 500 may reproduce a corresponding content in response to a content reproduction event being generated. Additionally, the processor 502 may drive at least one of the sensor module 504 and the communication module 512 in response to the content being reproduced. For example, the processor 502 may determine whether the content reproduction event is generated or not based on at least one of input information detected through the input module 508 and sensor data detected through the sensor module 504. Herein, the content may include at least one of video data or audio data.

In operation 603, the electronic device may detect ambient environment information of the electronic device. For example, the processor 502 may detect ambient environment information of the electronic device 500 through the sensor module 504. For example, the processor 502 may detect an ambient sound in a specific direction using reception beamforming technology or a beamforming microphone sensor. For example, the processor 502 may receive ambient environment information detected by an external electronic device through the communication module 512. Herein, information related to the external electronic device may include information such as completion of an operation, an operation progress situation, generation of an operation error, etc. of various external electronic devices interworking with an IoT environment. Herein, the external electronic device may include an IoT device such as a portable terminal, a wearable device, a TV, a washing machine, an electronic cooking device, a light, and various entrance doors, etc.

In operation 605, the electronic device may detect generation of a notification event based on the ambient environment information. For example, the processor 502 may determine whether a notification event is generated or not by comparing the ambient environment information (for example, a characteristic point of the ambient environment information) and a notification event detection variable stored in the memory 506.

In operation 607, the electronic device may determine an attribute regarding notification information in response to the notification event being generated. For example, the processor 502 may determine the attribute regarding the notification information based on at least one of a characteristic of the content, the notification event, an attribute of the electronic device 500, or an attribute of the external electronic device. Herein, the notification information may include the ambient environment information corresponding to the notification event, pre-defined notification data corresponding to the notification event, or notification data received from the external electronic device. For example, when a doorbell sound is detected as the notification event, the notification information may include a voice message saying "The doorbell is ringing" corresponding to the generation of the doorbell event. The characteristic of the content may include at least one of the type of the content or the volume of the content corresponding to time when the notification event is generated. The notification data received from the external electronic device may include information for informing of completion of an operation, an operation progress situation, generation of an operation error of the external electronic device, such as a voice, an image, a vibration, etc.

In operation 609, the electronic device may output the content and the notification information corresponding to the notification event based on the attribute regarding the notification information, and output the content. For example, the processor 502 may mix the content and the notification information of a vibration form based on a notification output variable, and output the content. In this case, the processor 502 may indicate the type of the notification information using at least one of a vibration pattern or a vibration intensity. In another example, the processor 502 may mix audio data of the content with the notification information of an audio form based on the attribute regarding the notification information, and output the content. Additionally, the processor 502 may adjust a mixing ratio of the notification information based on an input to identify the notification information and display that the notification information is being mixed on video data of the content, in response to the audio data mixed with the notification information being outputted.

According to various embodiments of the present disclosure, the processor 502 may determine the attribute regarding the notification information based on the notification information and the characteristic of the content. For example, the processor 502 may determine an output time and an output volume of the notification information by detecting similarity between the notification information and the audio data of the content corresponding to the time when the notification event is generated, and a volume of the audio data.

According to various embodiments of the present disclosure, the processor 502 may determine the attribute regarding the notification information based on at least one of the attribute of the electronic device 500 or the attribute of the external electronic device. For example, the processor 502 may determine a screen size attribute of the electronic device to display information on occurrence of a visitor, which is received from an entrance door interworking with an IoT environment. For example, when the screen of the electronic device is greater than or equal to a specific size, the electronic device may receive the appearance of the visitor as an image or a video, and display the image or the video. When the screen of the electronic device is smaller than the specific size, the electronic device may display brief information regarding the occurrence of the visitor or the visitor. In another example, the electronic device may determine the screen size attribute of the electronic device to display information on a washing time received from a washing machine interworking with the IoT environment. For example, when the screen of the electronic device is greater than or equal to a specific size, the electronic device may display the washing time on a part of the screen, and, when the screen of the electronic device is smaller than the specific size, the electronic device may output a notification sound regarding the washing time at regular intervals.

According to various embodiments of the present disclosure, the processor 502 may output the content and the notification information separately. For example, when the electronic device 500 supports a stereo, the processor 502 may output the audio of the content and the notification information of the audio form in different directions. In another example, the processor 502 may output the video data of the content to a first area of the screen of the electronic device 500, and may output a notification image to a second area of the screen of the electronic device 500.

Figure 7:
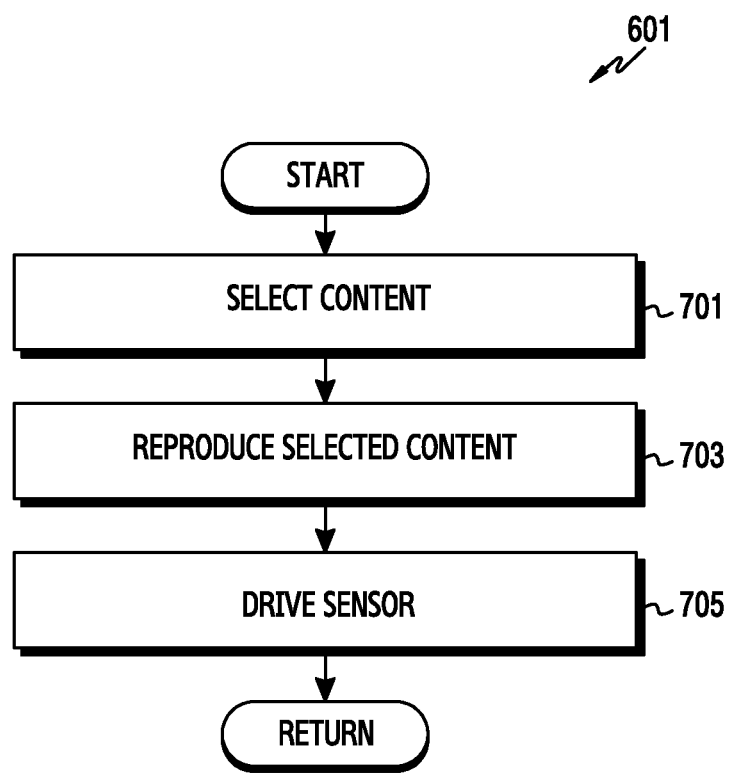
FIG. 7 illustrates a flowchart for reproducing a selected content in an electronic device according to various embodiments of the present disclosure.

FIG. 7 illustrates a flowchart for reproducing a selected content in an electronic device according to various embodiments of the present disclosure. Hereinafter, the operation of reproducing the content in operation 601 of FIG. 6 will be explained.

Referring to FIG. 7, in operation 701, the electronic device (for example, the electronic device 101, 201, or 500) may select a content. For example, the processor 502 of the electronic device 500 may select a content corresponding to data which is received through the input module 508 or the sensor module 504. For example, the processor 502 may select a content in response to a motion of the electronic device 500 detected through the sensor module 504.

In operation 703, the electronic device may reproduce the selected content. For example, the processor 502 of the electronic device 500 may control the output module 510 to output at least one of video data or audio data of the selected content.

In operation 705, the electronic device may drive a sensor to detect ambient environment information in response to the content being reproduced. For example, the processor 502 of the electronic device 500 may drive a microphone, a camera, an ultrasonic sensor, etc. to detect the ambient environment information.

According to various embodiments of the present disclosure, the processor 502 may drive the communication module 512 to receive ambient environment information in response to the content being reproduced.

Figure 8:
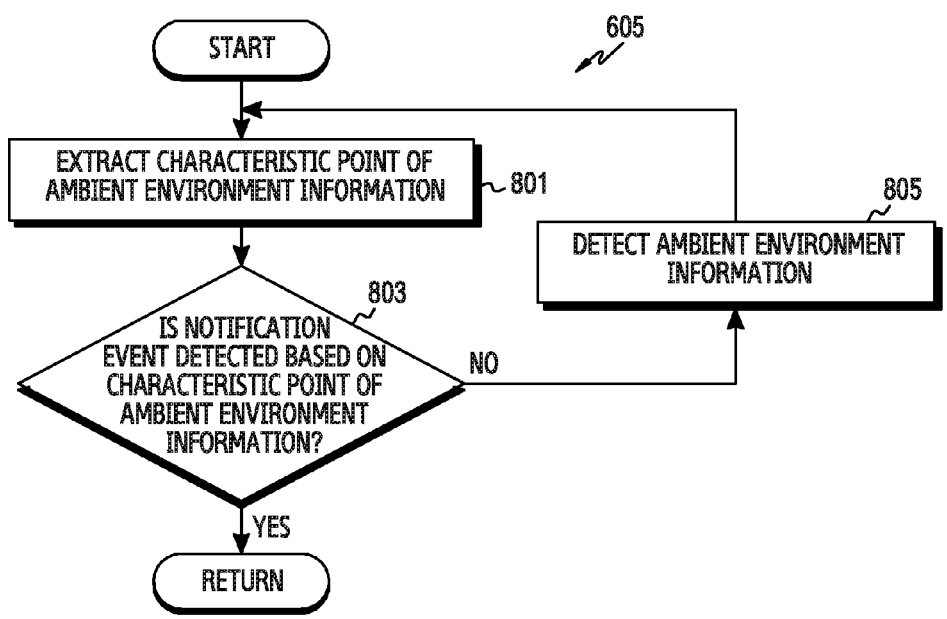
FIG. 8 illustrates a flowchart for detecting a notification event based on a characteristic point of ambient environment information in an electronic device according to various embodiments of the present disclosure.

FIG. 8 illustrates a flowchart for detecting a notification event based on a characteristic point of ambient environment information in an electronic device according to various embodiments of the present disclosure. Hereinafter, the operation of detecting the generation of the notification event based on the ambient environment information in operation 605 of FIG. 6 will be explained.

Referring to FIG. 8, in operation 801, the electronic device (for example, the electronic device 101, 201, or 501) may extract a characteristic point of ambient environment information. Herein, the electronic device may determine a characteristic point extraction method based on a characteristic of a sensor for detecting the ambient environment information, and a characteristic of the ambient environment information received from the sensor. For example, the processor 502 may extract a characteristic point of an ambient sound detected by the sensor module 504 using a characteristic point extraction method such as a zero-crossing method, an amplitude change detection method, a fast Fourier transform (FFT) method, etc. In another example, the processor 502 may determine the characteristic point extraction method based on a characteristic of ambient environment information received from an external electronic device. In another example, the processor 502 may receive the characteristic point of the ambient environment information which is extracted by the external electronic device.

In operation 803, the electronic device may detect whether a notification event is generated or not based on the characteristic point of the ambient environment information. For example, the processor 500 may detect a notification event by comparing the characteristic point of the ambient sound and a notification event detection variable stored in the memory 506. When the characteristic point of the ambient sound and the notification event detection variable are not determined to be similar to each other, the processor 502 may determine that the notification event is not generated. When the characteristic point of the ambient sound and the notification event detection variable are determined to be similar to each other, the processor 502 may determine that the notification event is generated. In this case, the processor 502 may determine the similarity between the characteristic point of the ambient sound and the notification event detection variable by estimating the similarity between the characteristic point of the ambient sound and the notification event detection variable.

When the electronic device does not detect the generation of the notification event, the electronic device may detect the ambient environment information of the electronic device in operation 805. For example, the processor 502 may detect the ambient environment information of the electronic device 500 through the sensor module 504 as in operation 603 of FIG. 6.

In operation 801, the electronic device may extract a characteristic point of the ambient environment information detected in operation 805.

When the electronic device detects the generation of the notification event, the electronic device may determine an attribute regarding notification information in response to the notification event being generated in operation 607 of FIG. 6.

Figure 9:
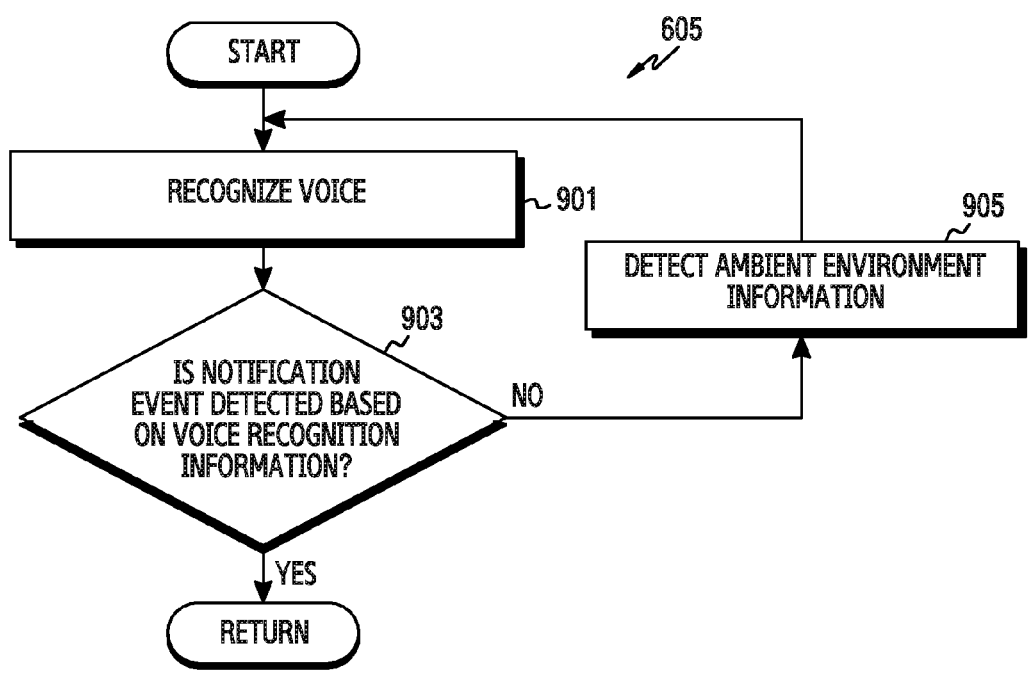
FIG. 9 illustrates a flowchart for detecting a notification event based on voice recognition information in an electronic device according to various embodiments of the present disclosure.

FIG. 9 illustrates a flowchart for detecting a notification event based on voice recognition information in an electronic device according to various embodiments of the present disclosure. Hereinafter, the operation of detecting the notification event based on the ambient environment information in operation 605 of FIG. 6 will be explained.

Referring to FIG. 9, in operation 901, the electronic device (for example, the electronic device 101, 201, or 500) may recognize a voice. For example, the processor 502 of the electronic device 500 may recognize a voice from an ambient sound detected through the sensor module 504.

In operation 903, the electronic device may detect whether a notification event is generated or not based on the result of the recognition of the voice. For example, when the result of the recognition of the voice matches a notification event detection variable stored in the memory 506, the processor 502 of the electronic device 500 may determine that the notification event is generated. For example, when the result of the recognition of the voice does not match the notification event detection variable stored in the memory 506, the processor 502 of the electronic device 500 may determine that the notification event is not generated. Herein, the notification event detection variable may include a predetermined name and a predetermined title (for example, mother or baby) for causing a notification to be generated.

When the generation of the notification event is not detected, the electronic device may detect ambient environment information of the electronic device in operation 905. For example, the processor 502 may detect the ambient environment information of the electronic device 500 through the sensor module 504 as in operation 603 of FIG. 6.

When the generation of the notification event is detected, the electronic device may determine an attribute regarding notification information in response to the generation of the notification event in operation 607 of FIG. 6.

Figure 10:
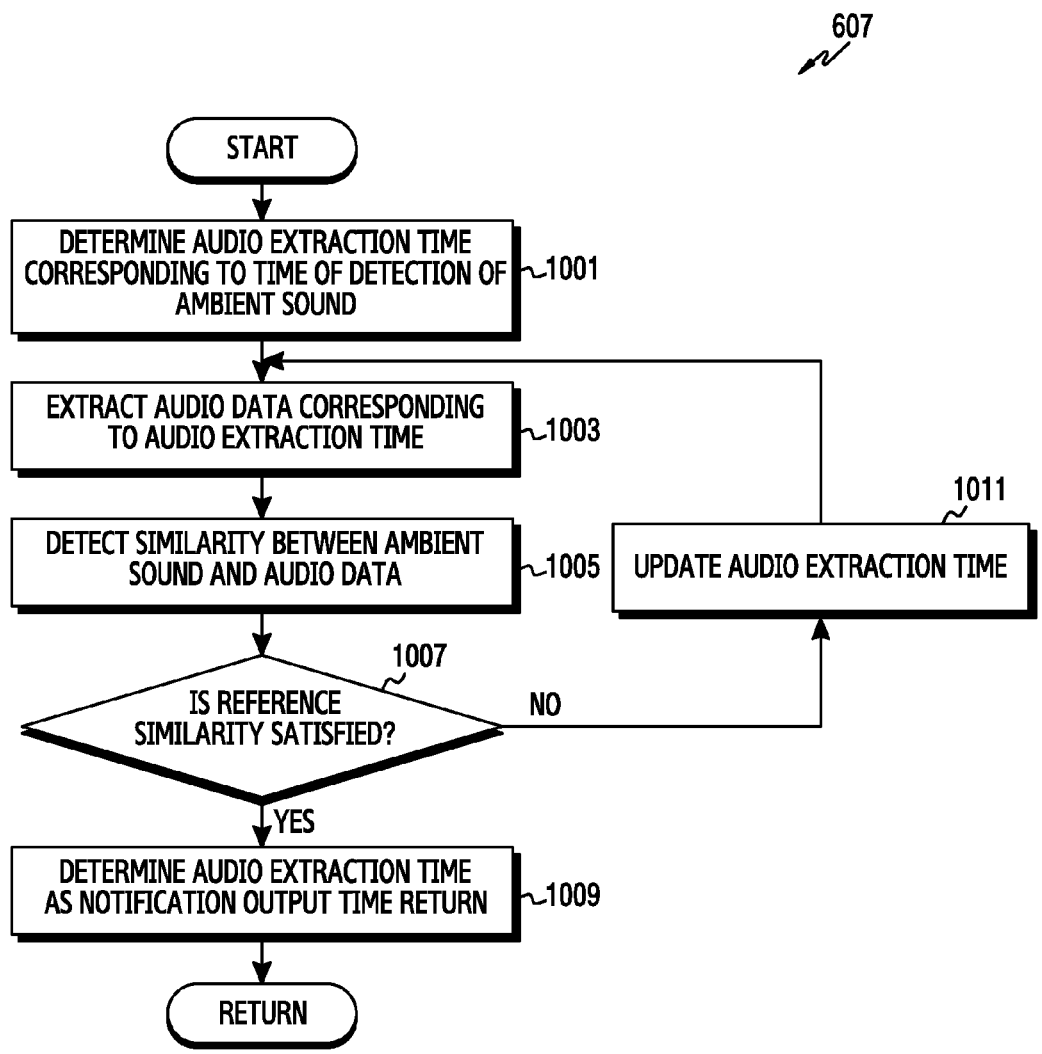
FIG. 10 illustrates a flowchart for determining a reproduction time of notification information in an electronic device according to various embodiments of the present disclosure.

FIG. 10 illustrates a flowchart for determining a reproduction time of notification information in an electronic device according to various embodiments of the present disclosure. Hereinafter, the operation of determining the attribute regarding the notification information in operation 607 of FIG. 6 will be explained.

Referring to FIG. 10, in operation 1001, the electronic device (for example, the electronic device 101, 201, or 500) may determine an audio extraction time of a content corresponding to time when a notification event is generated. For example, when generation of a notification event corresponding to a baby's crying is detected, the processor 502 of the electronic device 500 may determine the time when the baby's crying is detected as the audio extraction time of the content.

In operation 1003, the electronic device may extract audio data of the content corresponding to the audio extraction time. For example, when the time of detection of the baby's crying is determined as the audio extraction time of the content in operation 1001, the processor 502 of the electronic device 500 may extract the audio data of the content corresponding to the time of detection of the baby's crying.

In operation 1005, the electronic device may detect similarity between notification information corresponding to the notification event and the audio data of the content corresponding to the audio extraction time. For example, the processor 502 of the electronic device 500 may detect the similarity by comparing an ambient sound corresponding to the notification event and a characteristic point of the audio data of the content corresponding to the audio extraction time.

In operation 1007, the electronic device may determine whether the similarity between the notification information corresponding to the notification event and the audio data of the content corresponding to the audio extraction time satisfies reference similarity or not. For example, when the similarity between the notification information and the audio data of the content is lower than the reference similarity, the processor 502 may determine that the reference similarity is satisfied. When the similarity between the notification information and the audio data of the content is higher than or equal to the reference similarity, the processor 502 may determine that the reference similarity is not satisfied.

In operation 1009, when the similarity between the notification information and the audio data of the content satisfies the reference similarity, the electronic device may determine the audio extraction time of the content as an output time of the notification information.

When the similarity between the notification information and the audio data of the content does not satisfy the reference similarity, the electronic device may update the audio extraction time of the content in operation 1011. For example, when a notification sound corresponding to the notification event and the audio data of the content are determined to be similar to each other, the processor 502 of the electronic device 500 may delay extracting the audio for a predetermined time.

Figure 11:
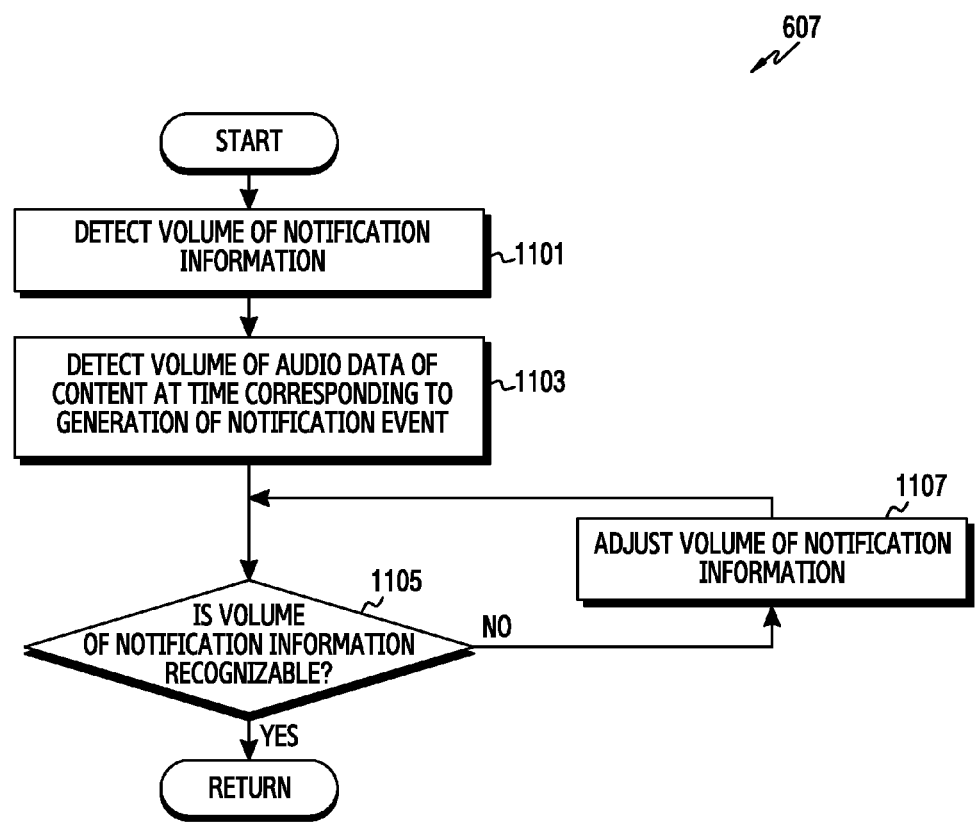
FIG. 11 illustrates a flowchart for adjusting a volume to allow a user to recognize an output volume of notification information in an electronic device according to various embodiments of the present disclosure.

FIG. 11 illustrates a flowchart for adjusting a volume to allow the user to recognize a notification sound of notification information in an electronic device according to various embodiments of the present disclosure. Hereinafter, the operation of determining the attribute regarding the notification information in operation 607 of FIG. 6 will be explained.

Referring to FIG. 11, in operation 1101, the electronic device (for example, the electronic device 101, 201, or 500) may detect an output volume of notification information corresponding to a notification event. Herein, the output volume of the notification information may be determined to correspond to a volume of an ambient sound detected by the sensor module 504 or may include a volume fixed at a predetermined level.

In operation 1103, the processor 502 may detect an output volume of a content corresponding to time when the notification event is generated. For example, when a notification event is generated by baby's crying, the processor 502 of the electronic device 500 may detect the volume of the content from the time when the baby's crying is detected from the content which is being reproduced.

In operation 1105, the electronic device may determine whether the user can recognize the notification information based on the output volume of the content detected in operation 1103 and the output volume of the notification information. For example, when the output volume of the content detected in operation 1103 is greater than the output volume of the notification information by more than a predetermined ratio, the processor 502 of the electronic device 500 may determine that the user cannot recognize the notification information. When the output volume of the content detected in operation 1103 is greater (or smaller) than the output volume of the notification information by less than the predetermined ratio, the processor 502 may determine that the user can recognize the notification information.

When the electronic device determines that the user cannot recognize the notification information corresponding to the notification event, the electronic device may adjust the output volume of the notification information in operation 1107. For example, the processor 502 of the electronic device 500 may increase the output volume of the notification information at a predetermined rate. In this case, the processor 502 may increase the output volume of the notification information based on the output volume of the content detected in operation 1103.

According to various embodiments of the present disclosure, the electronic device may adjust the volume of the notification information based on similarity between the notification sound of the notification information and the audio data of the content at the time when the notification event is generated. For example, when the similarity between the notification sound of the notification information and the audio data of the content at the time when the notification event is generated exceeds a predetermined threshold value, the processor 502 may adjust the volume of the notification information in proportion to the similarity. Herein, the similarity may be measured based on a characteristic point of the notification sound of the notification information and a characteristic point of the audio data of the content at the time when the notification event is generated. In this case, as the similarity between the characteristic points increases, the processor 502 may determine that it is difficult to recognize the notification information and thus increase the volume of the notification information.

Figure 12:
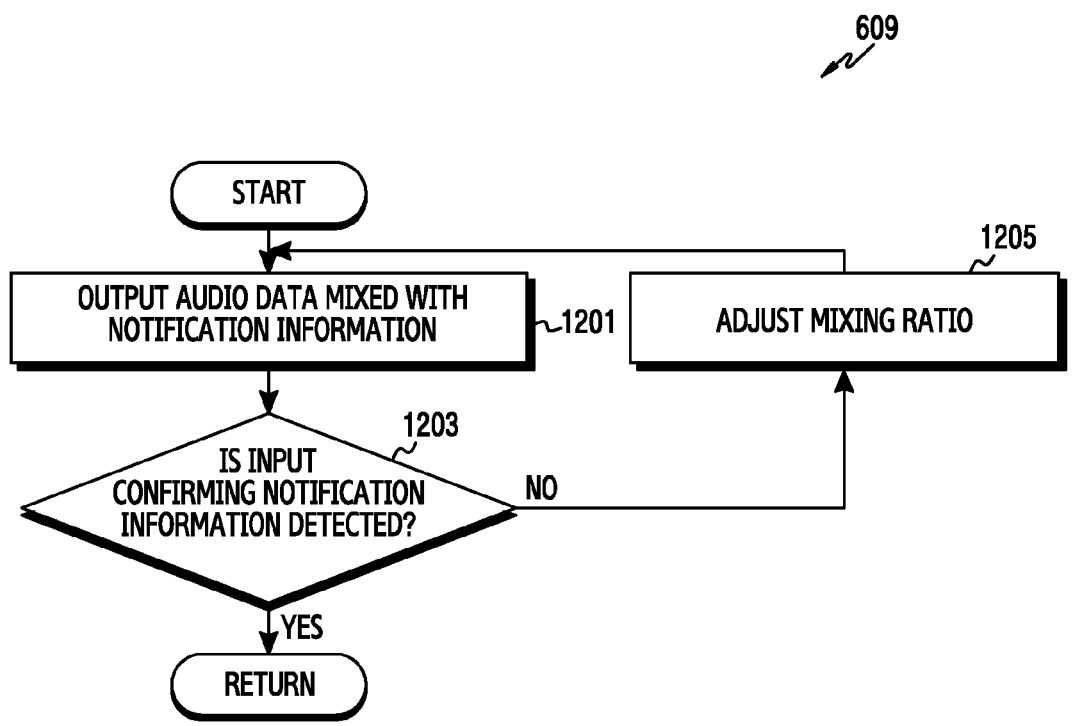
FIG. 12 illustrates a flowchart for adjusting a mixing ratio of audio data of a content which is mixed with notification information of an audio form in an electronic device according to various embodiments of the present disclosure.

FIG. 12 illustrates a flowchart for adjusting a mixing ratio of audio data of a content which is mixed with notification information of an audio form in an electronic device (for example, the electronic device 101, 201, or 500) according to various embodiments of the present disclosure. Hereinafter, the operation of outputting the content and the notification information based on the attribute regarding the notification information in operation 609 of FIG. 6 will be explained.

Referring to FIG. 12, in operation 1201, the electronic device (for example, the electronic device 101, 201, or 500) may output audio data of a content which is mixed with notification information of an audio form. For example, the processor 502 of the electronic device 502 may mix a baby's crying corresponding to generation of a notification event and audio data of a content, and output the content.

In operation 1203, the electronic device may determine whether an input confirming the notification information is detected or not. For example, the processor 502 of the electronic device 500 may determine whether sensor data such as a motion of taking off the electronic device 500 from the user's body, a user's motion to react to the notification information, etc. is detected through the sensor module 504.

When the input confirming the notification information is not detected, the electronic device may adjust the mixing ratio of the notification information of the audio form and the audio data of the content in operation 1205. For example, the processor 502 of the electronic device 500 may adjust the mixing ratio to increase the output volume of the notification information in comparison to the volume of the audio data of the content.

According to various embodiments of the present disclosure, the electronic device may generate a vibration of a vibration pattern or a vibration intensity corresponding to the notification event while the content is being reproduced. For example, when baby's crying is detected while the content is being reproduced, the processor 502 may generate the vibration corresponding to the baby's crying three times.

According to an embodiment of the present disclosure, when the electronic device does not detect the input confirming the notification information, the electronic device may additionally generate a vibration corresponding to the notification event. For example, when the input confirming the notification information is not detected, the processor 502 of the electronic device 500 may additionally generate the vibration of the vibration pattern or the vibration intensity corresponding to the notification event.

Figure 13:
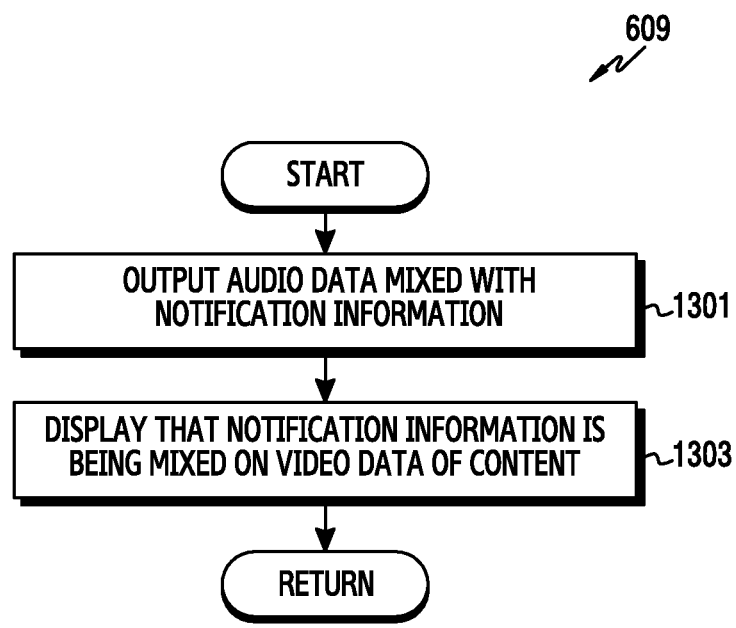
FIG. 13 illustrates a flowchart for displaying that notification information is being mixed on video data of a content which is mixed with the notification information of an audio form in an electronic device according to various embodiments of the present disclosure.

FIG. 13 illustrates a flowchart for displaying that notification information is being mixed with video data of a content which is mixed with the notification information of an audio form in an electronic device according to various embodiments of the present disclosure. Hereinafter, another operation of outputting the content and the notification sound of the notification information based on the attribute regarding the notification information in operation 609 of FIG. 6 will be explained.

Referring to FIG. 13, in operation 1301, the electronic device (for example, the electronic device 101, 201, or 500) may output audio data of a content which is mixed with notification information of an audio form. For example, the processor 502 of the electronic device 500 may control to mix a doorbell sound corresponding to generation of a notification event and music of a content, and output the content.

Figure 14A:
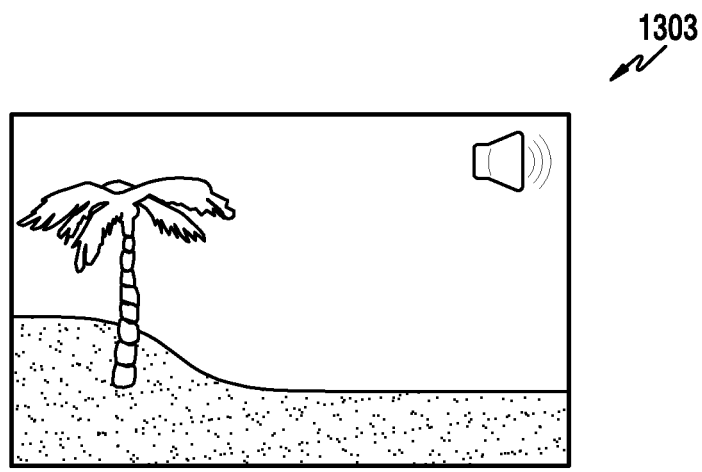
FIGS. 14A to 14C illustrate views showing a screen for informing that notification information is mixed and reproduced in an electronic device according to various embodiments of the present disclosure.
Figure 14B:
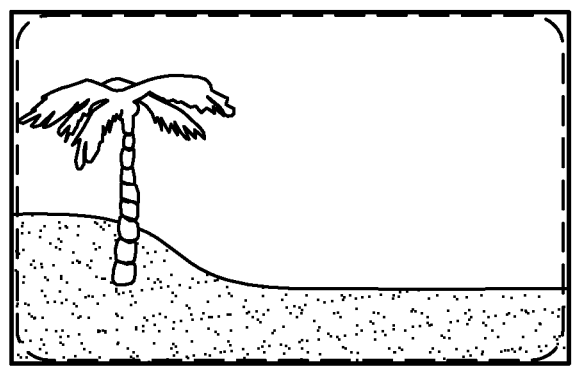
Figure 14C:
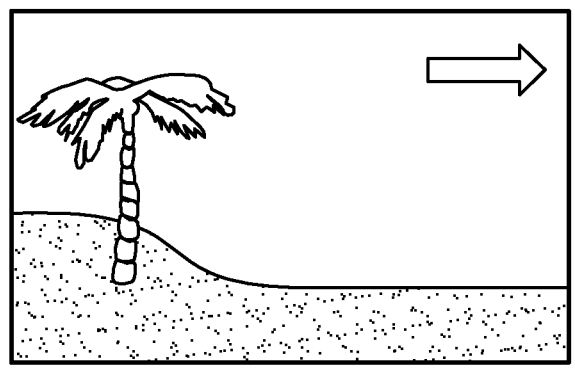

FIGS. 14A to 14C illustrate views showing a screen for informing that notification information is mixed and reproduced in an electronic device according to various embodiments of the present disclosure.

In operation 1303, the electronic device may display mixing information of video data of the content and the notification information of the audio form in response to the audio data of the content mixed with the notification information of the audio form being outputted. For example, the processor 502 of the electronic device 500 may display a sign informing that a notification sound is being mixed on a part of the screen of the electronic device 500 in order to display that the audio data of the content and the notification information of the audio form corresponding to the notification event are being mixed as shown in FIG. 14A. For example, as shown in FIG. 14B, the processor 502 of the electronic device 500 may generate an event indicating that a notification sound is being outputted on the border of the screen of the electronic device 500 in order to display that the audio data of the content and the notification information of the audio form corresponding to the notification event are being mixed. For example, when the audio data of the content and the notification information of the audio form corresponding to the notification event are being mixed, the processor 502 of the electronic device 500 may display a direction in which the notification information is detected as shown in FIG. 14C.

Figure 15:
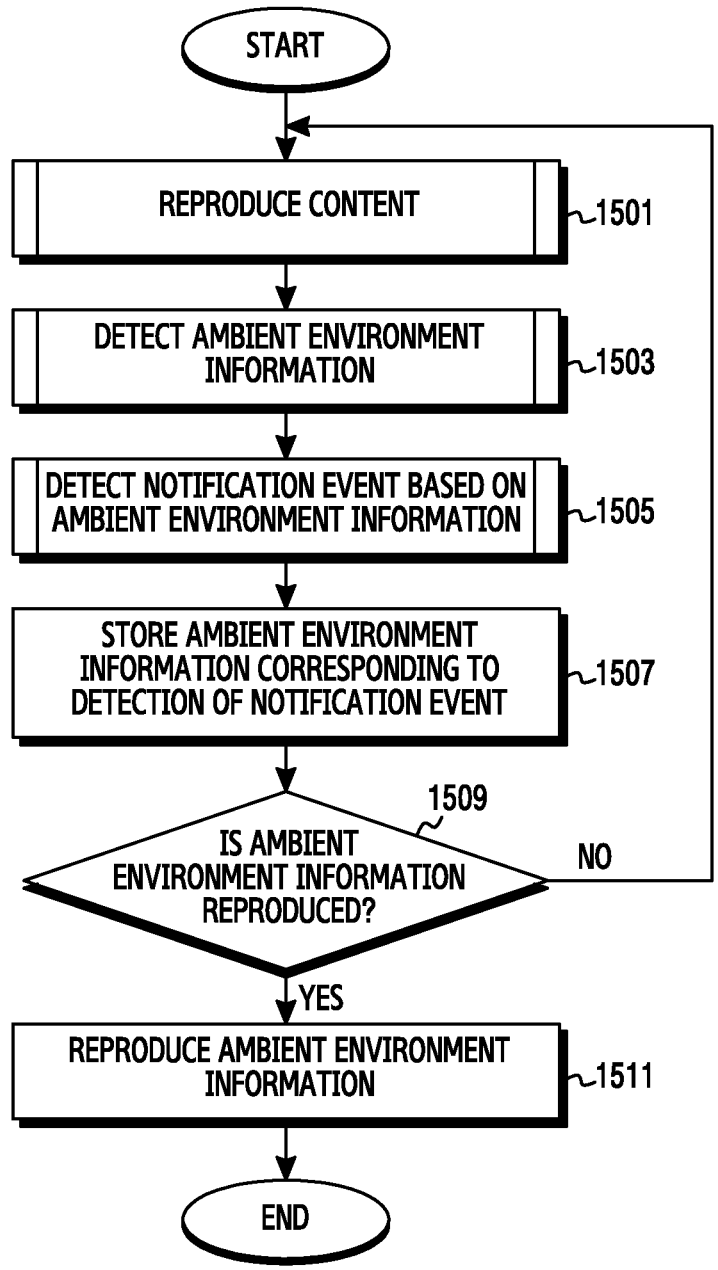
FIG. 15 illustrates a flowchart for reproducing stored ambient environment information in response to an input to reproduce the ambient environment information in an electronic device according to various embodiments of the present disclosure.

FIG. 15 illustrates a flowchart for reproducing stored ambient environment information in response to an input to reproduce the ambient environment information in an electronic device according to various embodiments of the present disclosure.

Referring to FIG. 15, in operation 1501, the electronic device (for example, the electronic device 101, 201 or 500) may reproduce a content. For example, the electronic device may reproduce the content in the same way as in operation 601 of FIG. 6. Additionally, the processor 502 of the electronic device 500 may drive at least one of the sensor module 504 and the communication module 512 in response to the content being reproduced.

In operation 1503, the electronic device may detect ambient environment information. For example, the electronic device may detect the ambient environment information in the same way as in operation 603 of FIG. 6. For example, the processor 502 may collect the ambient environment information through at least one of the sensor module 504 and the communication module 512.

In operation 1505, the electronic device may detect generation of a notification event based on the ambient environment information. For example, the electronic device may detect the notification event based on the ambient environment information in the same way as in operation 605 of FIG. 6.

In operation 1507, the electronic device may store the ambient environment information corresponding to the generation of the notification event. For example, the processor 502 of the electronic device 500 may store an ambient sound corresponding to the generation of the notification event in the memory 506.

In operation 1509, the electronic device may determine whether to reproduce the ambient environment information or not. For example, when an input to reproduce the ambient environment information corresponding to the notification event is not identified while the content is being reproduced, the processor 502 of the electronic device 500 may continue reproducing the content.

In operation 1511, the electronic device may reproduce the pre-stored ambient environment information corresponding to the notification event in response to the input to reproduce the ambient environment information. For example, the processor 502 of the electronic device may reproduce a stored ambient sound in response to an input to reproduce the ambient sound stored in the memory 506.

According to various embodiments of the present disclosure, the electronic device may execute the configuration of FIG. 6 of outputting the content and the notification information, and the configuration of FIG. 15 of storing the ambient environment information corresponding to the notification event in parallel.

Figure 16:
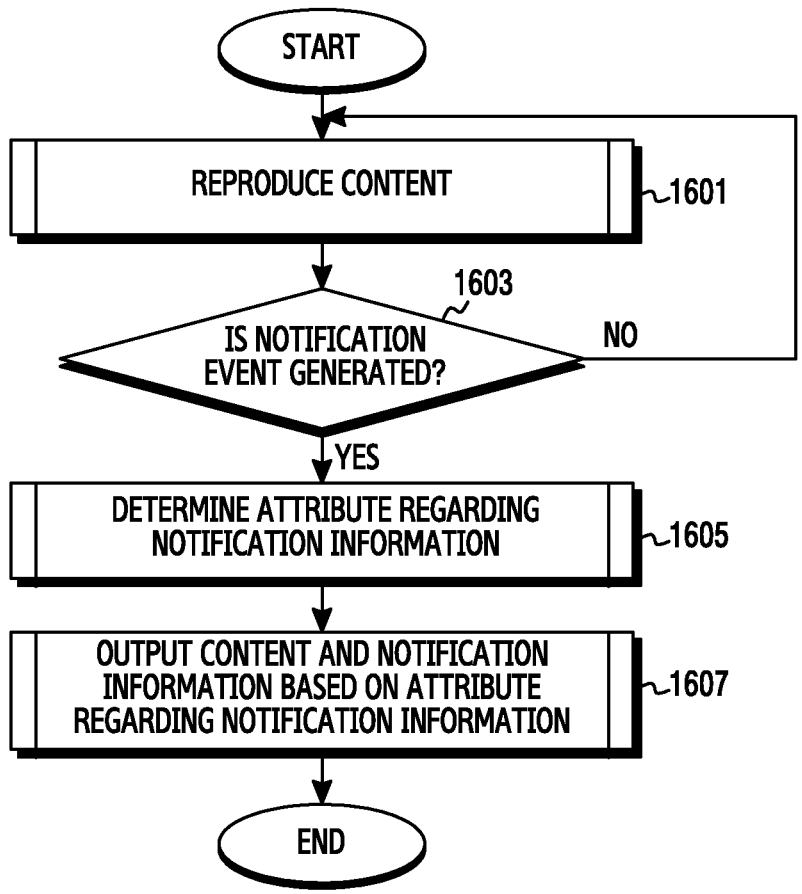
FIG. 16 illustrates a flowchart for outputting a content and notification information based on an attribute regarding notification information in an electronic device according to various embodiments of the present disclosure.
Figure 17:
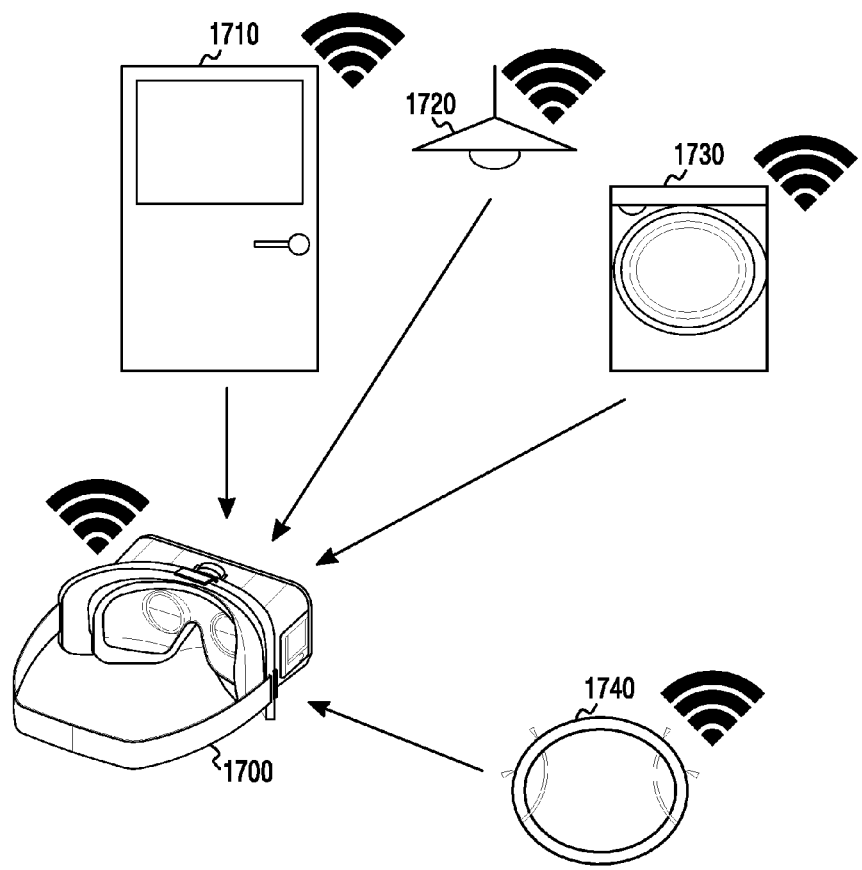
FIG. 17 illustrates a view showing an electronic device which receives ambient environment information from external electronic devices according to various embodiments of the present disclosure.

FIG. 16 illustrates a flowchart for outputting a content and notification information based on an attribute regarding the notification information in an electronic device according to various embodiments of the present disclosure. Hereinafter, an operation of outputting a content and notification information using a configuration for receiving ambient environment information from external electronic devices as shown in FIG. 17 will be explained.

Referring to FIG. 16, in operation 1601, the electronic device (for example, the electronic device 101, 201, or 500) may reproduce a content. For example, the electronic device may reproduce the content in the same way as in operation 601 of FIG. 6. Additionally, the processor 502 may drive the communication module 512 in response to the content being reproduced.

In operation 1603, the electronic device may determine whether a notification event is generated or not based on whether ambient environment information is received from an external electronic device (for example, an IoT device) or not. For example, in FIG. 17, when an electronic device 1700 (for example, the electronic device 101, 201, or 500) receives operation situation information of external electronic devices from various external electronic devices interworking with an IoT environment, the electronic device 1700 may determine that a notification event is generated. For example, the operation situation information of the external electronic device may include information on an operation of an entrance door 1710 (for example, opening or closing), information on an operation of a light 1720 (for example, turning on or turning off), information on an operation of a washing machine 1730 (for example, washing, finishing, power, breaking down), and information on an operation of a cleaner 1740 (for example, cleaning, error/clogging, finishing, power).

In operation 1603, when the ambient environment information is not received from the external electronic device, the electronic device may determine that the notification event is not generated, and continue reproducing the content as in operation 1601.

In operation 1605, the electronic device may determine an attribute regarding notification information in response to the notification event being generated. For example, the electronic device may determine the attribute regarding the notification information based on at least one of a characteristic of the content, the notification event, an attribute of the electronic device 500, or an attribute of the external electronic device in the same way as in operation 607 of FIG. 6.

In operation 1607, the electronic device may output the content and the notification information corresponding to the ambient environment information based on the attribute regarding the notification information, and output the content. For example, the electronic device may mix the content and the notification information based on the attribute regarding the notification information as in operation 609 of FIG. 6, and output the content.

According to various embodiments of the present disclosure, the electronic device may determine the attribute regarding the notification information based on the notification information and the characteristic of the content. For example, the electronic device may determine an output time and an output volume of the notification information by detecting similarity between the notification information and the audio data of the content corresponding to the time when the notification event is generated, and a volume of the audio data.

According to various embodiments of the present disclosure, the electronic device may determine the attribute regarding the notification information based on at least one of the attribute of the electronic device or the attribute of the external electronic device. For example, the electronic device may determine a screen size attribute of the electronic device to display information on occurrence of a visitor, which is received from an entrance door interworking with an IoT environment. For example, when the screen of the electronic device is greater than or equal to a specific size, the electronic device may receive the appearance of the visitor as an image or a video, and display the image or the video. When the screen of the electronic device is smaller than the specific size, the electronic device may display brief information regarding the occurrence of the visitor or the visitor. In another example, the electronic device may determine the screen size attribute of the electronic device to display information on a washing time received from a washing machine interworking with the IoT environment. For example, when the screen of the electronic device is greater than or equal to a specific size, the electronic device may display the washing time on a part of the screen, and, when the screen of the electronic device is smaller than the specific size, the electronic device may output a notification sound regarding the washing time at regular intervals.

According to various embodiments of the present disclosure, the electronic device may output the content and the notification information separately. For example, when the electronic device supports a stereo, the electronic device may output the audio of the content and the notification information of the audio form in different directions. In another example, the electronic device may output the video data of the content to a first area of the screen of the electronic device, and may output a notification image to a second area of the screen of the electronic device.

According to various embodiments of the present disclosure, a method for operating of an electronic device includes: in response to a content being reproduced, acquiring ambient environment information on the electronic device through a sensor module which is electrically connected to the electronic device, or an external electronic device; determining at least one attribute regarding notification information corresponding to the ambient environment information; and providing the notification information in connection with the content based on the at least one attribute.

According to various embodiments of the present disclosure, the ambient environment information may include information corresponding to a designated event.

According to various embodiments of the present disclosure, the providing the notification information in connection with the content based on the at least one attribute may include providing additional information which is acquired from the external electronic device or an attribute regarding the external electronic device in connection with the notification information.

According to various embodiments of the present disclosure, the ambient environment information may include at least one of an ambient sound, an ambient image, a motion of an ambient object, an ambient smell, ambient temperature/humidity, ambient lighting, ambient ultraviolet rays, or operation situation information of the external electronic device.

According to various embodiments of the present disclosure, the notification information may include at least one of ambient environment information, pre-stored notification data, or notification data which is received from the external electronic device.

According to various embodiments of the present disclosure, the at least one attribute regarding the notification information may include an output time of the notification information corresponding to generation of the notification event, or an output volume of the notification information.

According to various embodiments of the present disclosure, the determining the at least one attribute regarding the notification information may include: detecting similarity between audio data of the content corresponding to a time when the ambient environment information is acquired, and the notification information corresponding to the ambient environment information; and determining the output time of the notification information based on the similarity.

According to various embodiments of the present disclosure, the determining the at least one attribute regarding the notification information may include: comparing audio data of the content corresponding to a time when the ambient environment information is acquired and an output volume of the notification information corresponding to the ambient environment information; and adjusting a ratio between an output volume of the audio data of the content and the output volume of the notification information based on a result of the comparing.

According to various embodiments of the present disclosure, the determining the at least one attribute regarding the notification information may include: detecting similarity between the content corresponding to a time when the ambient environment information is acquired and the notification information corresponding to the ambient environment information; and adjusting a ratio between an output volume of the content and the output volume of the notification information based on the similarity.

According to various embodiments of the present disclosure, the providing the notification information in connection with the content may include: detecting an input confirming the notification information corresponding to the ambient environment information in response to the content and the notification information being provided; and, when the input confirming the notification information is not detected, adjusting a ratio between an output volume of audio data of the content and an output volume of the notification information.

According to various embodiments of the present disclosure, the providing the content and the notification information may include mixing the content and the notification information and outputting the content.

The term "module" as used herein may, for example, mean a unit including one of hardware, software, and firmware or a combination of two or more of them. The "module" may be interchangeably used with, for example, the term "unit", "logic", "logical block", "component", or "circuit". The "module" may be a minimum unit of an integrated component element or a part thereof The "module" may be a minimum unit for performing one or more functions or a part thereof The "module" may be mechanically or electronically implemented. For example, the "module" according to the present disclosure may include at least one of an application-specific integrated circuit (ASIC) chip, a field-programmable gate arrays (FPGA), and a programmable-logic device for performing operations which has been known or are to be developed hereinafter.

According to various embodiments of the present disclosure, at least some of the devices (for example, modules or functions thereof) or the method (for example, operations) according to the present disclosure may be implemented by a command stored in a computer-readable storage medium in a programming module form. The instruction, when executed by a processor (e.g., the processor 120), may cause the one or more processors to execute the function corresponding to the instruction. The computer-readable recoding media may be, for example, the memory 130.

The computer readable recoding medium may include a hard disk, a floppy disk, magnetic media (e.g., a magnetic tape), optical media (e.g., a compact disc read only memory (CD-ROM) and a digital versatile disc (DVD)), magneto-optical media (e.g., a floptical disk), a hardware device (e.g., a read only memory (ROM), a random access memory (RAM), a flash memory), and the like. In addition, the program instructions may include high class language codes, which can be executed in a computer by using an interpreter, as well as machine codes made by a compiler. The aforementioned hardware device may be configured to operate as one or more software modules in order to perform the operation of the present disclosure, and vice versa.

Any of the modules or programming modules according to various embodiments of the present disclosure may include at least one of the above described elements, exclude some of the elements, or further include other additional elements. The operations performed by the modules, programming module, or other elements according to various embodiments of the present disclosure may be executed in a sequential, parallel, repetitive, or heuristic manner. Further, some operations may be executed according to another order or may be omitted, or other operations may be added. Various embodiments disclosed herein are provided merely to easily describe technical details of the present disclosure and to help the understanding of the present disclosure, and are not intended to limit the scope of the present disclosure. Therefore, it should be construed that all modifications and changes or modified and changed forms based on the technical idea of the present disclosure fall within the scope of the present disclosure.

The body-mounted electronic device and the operation method thereof according to various embodiments of the present disclosure output notification information corresponding to a dangerous situation caused by an external environment or a situation which needs a notification based on an attribute regarding the notification information, so that a user of the electronic device can recognize ambient environment information.

The body-mounted electronic device and the operation method thereof according to various embodiments of the present disclosure execute pre-stored ambient environment information corresponding to a notification event in response to an input to reproduce the ambient environment information, so that notification information that the user of the electronic device does not recognize can be reproduced again at a time or place that the user desires.

While the present disclosure has been shown and described with reference to various embodiments thereof, it will be understood by those skilled in the art that various changes in form and details may be made therein without departing from the spirit and scope of the present disclosure as defined by the appended claims and their equivalents.

What is claimed is:

1. An electronic device comprising:
   a sensor module;
   a memory; and
   a processor electrically connected to the sensor module and the memory,
   wherein the processor is configured to:
      reproduce a content,
      acquire ambient environment information through the sensor module or an external electronic device,
      determine at least one attribute regarding notification information corresponding to the ambient environment information, and
      provide the notification information in connection with the content based on the at least one attribute.

2. The electronic device of claim 1, wherein the ambient environment information comprises information corresponding to a designated event.

3. The electronic device of claim 2, wherein the processor is further configured to:
   compare the content corresponding to a time when the ambient environment information is acquired and an output volume of the notification information corresponding to the ambient environment information, and
   adjust a ratio between an output volume of the content and the output volume of the notification information based on the comparing.

4. The electronic device of claim 2, wherein the processor is further configured to:
   detect a similarity between the content corresponding to a time when the ambient environment information is acquired and the notification information corresponding to the ambient environment information, and
   adjust a ratio between an output volume of the content and the output volume of the notification information based on the similarity.

5. The electronic device of claim 1, wherein the processor is further configured to provide additional information which is acquired from the external electronic device or an attribute regarding the external electronic device in connection with the notification information.

6. The electronic device of claim 1, wherein the ambient environment information comprises at least one of an ambient sound, an ambient image, a motion of an ambient object, an ambient smell, an ambient temperature, an ambient humidity, ambient lighting, ambient ultraviolet rays, and operation situation information of the external electronic device.

7. The electronic device of claim 6, wherein the acquiring of the ambient sound comprises recognizing voice recognition information.

8. The electronic device of claim 1, wherein the notification information comprises at least one of ambient environment information, pre-stored notification data, and notification data which is received from the external electronic device.

9. The electronic device of claim 1, wherein the at least one attribute regarding the notification information comprises at least one of an output time of the notification information and an output volume of the notification information.

10. The electronic device of claim 9, wherein the processor is further configured to detect similarity between the content corresponding to a time when the ambient environment information is acquired, and the notification information corresponding to the ambient environment information, and determine the output time of the notification information based on the similarity.

11. The electronic device of claim 10, wherein the processor is further configured to delay an output time of the notification information if the similarity is greater than a threshold amount.

12. The electronic device of claim 1, wherein the processor is further configured to:
   determine whether an input confirming the notification information is detected through the sensor module, and
   when the input confirming the notification information is not detected, adjust a ratio between an output volume of audio data of the content and an output volume of the notification information.

13. The electronic device of claim 1, wherein the processor is further configured to mix the content and the notification information and output the mixed content and notification information.

14. A method for operating an electronic device, the method comprising:
   in response to a content being reproduced, acquiring ambient environment information through a sensor module, which is electrically connected to the electronic device, or an external electronic device;
   determining at least one attribute regarding notification information corresponding to the ambient environment information; and
   providing the notification information in connection with the content based on the at least one attribute.

15. The method of claim 14, wherein the ambient environment information comprises information corresponding to a designated event.

16. The method of claim 14, wherein the providing of the notification information comprises providing additional information which is acquired from the external electronic device or an attribute regarding the external electronic device in connection with the notification information.

17. The method of claim 14, wherein the ambient environment information comprises at least one of an ambient sound, an ambient image, a motion of an ambient object, an ambient smell, an ambient temperature, an ambient humidity, ambient lighting, ambient ultraviolet rays, and operation situation information of the external electronic device.

18. The method of claim 17, wherein the acquiring of the ambient sound comprises recognizing voice recognition information.

19. The method of claim 14, wherein the notification information comprises at least one of ambient environment information, pre-stored notification data, and notification data which is received from the external electronic device.

20. The method of claim 14, wherein the at least one attribute comprises at least one of an output time of the notification information corresponding to generation of the notification event and an output volume of the notification information.

21. The method of claim 20, wherein the determining of the at least one attribute comprises:
   detecting a similarity between audio data of the content corresponding to a time when the ambient environment information is acquired and the notification information corresponding to the ambient environment information; and
   determining the output time of the notification information based on the similarity.

22. The method of claim 21, further comprising delaying the output time of the notification information if the similarity is greater than a threshold amount.

23. The method of claim 14, wherein the determining of the at least one attribute comprises:
  comparing audio data of the content corresponding to a time when the ambient environment information is acquired and an output volume of the notification information corresponding to the ambient environment information; and
  adjusting a ratio between an output volume of the audio data of the content and the output volume of the notification information based on the comparing.

24. The method of claim 14, wherein the determining of the at least one attribute comprises:
  detecting similarity between the content corresponding to a time when the ambient environment information is acquired and the notification information corresponding to the ambient environment information; and
  adjusting a ratio between an output volume of the content and the output volume of the notification information based on the similarity.

25. The method of claim 14, wherein the providing of the notification information comprises:
  detecting an input confirming the notification information corresponding to the ambient environment information in response to the content and the notification information being provided; and
  when the input confirming the notification information is not detected, adjusting a ratio between an output volume of audio data of the content and an output volume of the notification information.

26. The method of claim 14, wherein the providing of the content and the notification information comprises mixing the content and the notification information and outputting the mixed content and notification information.

27. A non-transitory computer readable storage medium encoded with instructions which, when executed, perform the method of claim 14.

* * * * *